(12) United States Patent
Wenham et al.

(10) Patent No.: US 9,136,126 B2
(45) Date of Patent: Sep. 15, 2015

(54) METHOD OF FORMING DOPED REGIONS IN A PHOTOVOLTAIC DEVICE

(75) Inventors: Alison Maree Wenham, Cronulla (AU); Ziv Hameiri, Hillsdale (AU); Ji Jing Jia, Shanghai (CN); Ly Mai, Sefton (AU); Shi Zhengrong, Wuxi (CN); Budi Tjahjono, Kensington (AU); Stuart Ross Wenham, Cronulla (AU)

(73) Assignee: NewSouth Innovations Pty Limited, Sydney (AU)

( * ) Notice: Subject to any disclaimer, the term of this patent is extended or adjusted under 35 U.S.C. 154(b) by 565 days.

(21) Appl. No.: 13/148,797

(22) PCT Filed: Feb. 11, 2010

(86) PCT No.: PCT/AU2010/000145
§ 371 (c)(1),
(2), (4) Date: Feb. 8, 2012

(87) PCT Pub. No.: WO2010/091466
PCT Pub. Date: Aug. 19, 2010

(65) Prior Publication Data
US 2012/0125424 A1    May 24, 2012

(30) Foreign Application Priority Data

Feb. 11, 2009  (AU) .................. 2009900562
Mar. 3, 2009   (AU) .................. 2009900924

(51) Int. Cl.
| | | |
|---|---|---|
| *H01L 31/0216* | (2014.01) | |
| *H01L 31/18* | (2006.01) | |
| *H01L 21/268* | (2006.01) | |
| *H01L 21/225* | (2006.01) | |
| *H01L 31/0236* | (2006.01) | |

(52) U.S. Cl.
CPC .......... *H01L 21/268* (2013.01); *H01L 21/2252* (2013.01); *H01L 31/0236* (2013.01); *H01L 31/02168* (2013.01); *Y02E 10/50* (2013.01)

(58) Field of Classification Search
CPC .................. H01L 21/02675; H01L 21/02683; H01L 21/268; H01L 21/2252; H01L 21/2686; H01L 21/428; H01L 31/0236; H01L 31/02168
USPC .................. 136/242–265; 438/72, 89, 81, 83
See application file for complete search history.

(56) References Cited

U.S. PATENT DOCUMENTS

| | | | |
|---|---|---|---|
| 6,040,019 A * | 3/2000 | Ishida et al. | ........... 427/526 |
| 6,303,446 B1 | 10/2001 | Weiner et al. | |
| 6,429,037 B1 | 8/2002 | Wenham et al. | |
| 7,468,485 B1 | 12/2008 | Swanson | |
| 2005/0252544 A1 | 11/2005 | Rohtagi et al. | |
| 2006/0130891 A1 | 6/2006 | Carlson | |
| 2007/0169808 A1 | 7/2007 | Kherani et al. | |
| 2008/0290368 A1 | 11/2008 | Rubin | |
| 2009/0197086 A1 | 8/2009 | Rathi et al. | |
| 2010/0294349 A1 * | 11/2010 | Srinivasan et al. | ........... 136/255 |

FOREIGN PATENT DOCUMENTS

| | | |
|---|---|---|
| DE | 102006046726 A1 | 4/2008 |
| JP | 02-170543 A | 7/1990 |
| WO | 2006005116 A1 | 1/2006 |

OTHER PUBLICATIONS

The International Search Report and Written Opinion dated Apr. 16, 2010.

* cited by examiner

*Primary Examiner* — Keith Hendricks
*Assistant Examiner* — Kourtney S Carlson
(74) *Attorney, Agent, or Firm* — Thomas Horstemeyer, LLP

(57) ABSTRACT

A surface region of a semiconductor material on a surface of a semiconductor device is doped during its manufacture, by coating the surface region of the semiconductor material with a dielectric material surface layer and locally heating the surface of the semiconductor material in an area to be doped to locally melt the semiconductor material with the melting being performed in the presence of a dopant source. The heating is performed in a controlled manner such that a region of the surface of the semiconductor material in the area to be doped is maintained in a molten state without refreezing for a period of time greater than one microsecond and the dopant from the dopant source is absorbed into the molten semiconductor. The semiconductor device includes a semiconductor material structure in which a junction is formed and may incorporate a multi-layer anti-reflection coating. The anti-reflection coating is located on a light receiving surface of the semiconductor material structure and comprises a thin layer of thermal expansion mismatch correction material having a thermal expansion coefficient less than or equal to that of the semiconductor material, to provide thermal expansion coefficient mismatch correction. An anti-reflection layer is provided having a refractive index and thickness selected to match the semiconductor material structure so as to give good overall antireflection properties to the solar cell.

49 Claims, 8 Drawing Sheets

METHOD OF FORMING DOPED REGIONS IN A PHOTOVOLTAIC DEVICE

CROSS-REFERENCE TO RELATED APPLICATION

This application claims priority to PCT Application No. PCT/AU2010/000145, international filing date 11 Feb. 2010, which claims priority to Australian Application No. 2009900924, filed on 3 Mar. 2009 and Australian Application No. 2009900562, filed on 11 Feb. 2009.

INTRODUCTION

The present invention relates generally to the field of photovoltaics and in particular improvements to lasers and their use in solar cell manufacture is disclosed. A new anti-reflection coating arrangement is also described.

BACKGROUND

Laser doping of silicon in localised regions beneath metal contacts has been proposed for more than a decade as a low cost approach for potentially producing high performance solar cells with selective emitters. To date, despite more than a decade of research and problem solving, devices using laser doping in conjunction with an anti-reflection coating, have not achieved their expected performance due to defects, junction recombination or shunting arising from the laser doping process. In particular, defects adjacent to the melted regions resulting from the thermal expansion mismatch between the silicon and the overlying antireflection coating (ARC), inadequate mixing of the dopants incorporated into the molten silicon and unwanted ablation of the doped silicon are significant problems contributing to the poor electrical performance of devices using laser doping of localised areas beneath the metal contacts.

Further, most solar cells use an anti-reflection coating (ARC) on the semiconductor surface to reduce the amount of light reflected. The ARC is usually chosen to have the right refractive index and thickness so as to reduce the surface reflection to a minimum. A double layer ARC (DLARC) could also be used whereby the refractive index and thickness of each individual layer is chosen to reduce the overall reflection to a minimum, with the theoretical reflection minimum for a DLARC being below the theoretical minimum for a single layer ARC (SLARC). Most commercially manufactured solar cells use a SLARC as it is too complex and expensive to use a DLARC for the small additional benefits in performance.

Two problems that can result from using an ARC are: firstly, an ARC may make it difficult to passivate the semiconductor surface onto which it is deposited, therefore leading to increased recombination and device dark saturation current; and secondly, many potential ARC materials will have different thermal expansion coefficients to the semiconductor material onto which it is deposited, leading to stressing of the semiconductor surface with possible corresponding defect generation during treatment at elevated temperature. To overcome the first, surface treatments such as the growth of a thin thermally grown oxide layer to passivate the semiconductor surface prior to the deposition of the much thicker ARC have been used. With this arrangement the thin passivation layer does not significantly affect the operation of the ARL deposited over it.

However to date, a suitable solution does not appear to have been proposed for simultaneously achieving good ARC properties while simultaneously providing thermal expansion mismatch correction for the ARC and passivating the semiconductor material and surface. In reality, a high performance solar cell technology to be viable commercially needs to be able to use an ARC that performs all three functions while simultaneously being able to be deposited in a simple low cost process.

SUMMARY

A method is provided for doping a surface region of a semiconductor material on a surface of a semiconductor device during its manufacture, the surface region of the semiconductor material being coated with a dielectric material surface layer and the doping being performed in one or more localised regions on the surface region of the semiconductor material, the method comprising locally heating the surface of the semiconductor material in an area to be doped to locally melt the semiconductor material, the melting being performed in the presence of a dopant source whereby dopant from the dopant source is absorbed into the molten semiconductor and wherein the heating is performed in a controlled manner such that a region of the surface of the semiconductor material in the area to be doped is maintained in a molten state without refreezing for a period of time greater than one microsecond.

The dielectric material coating on the surface layer may perform one or more of the functions of a surface passivation coating, an antireflection coating, or a plating mask.

Preferably the area to be doped is progressively doped by sequentially locally heating regions within the area to be doped. The heating source may be continuously scanned over the surface of the semiconductor material such that the region being heated is continuously moving over the surface, creating a moving melting edge and a molten tail extending from a region of refrozen doped material. The heating source may be continuously scanned over the surface of the semiconductor material, in such a manner that a currently heated region overlaps previously heated regions whereby heating one region contributes heat to an adjacent previously heated region, and to which the source is no longer applied, to reduce a rate of cooling of the previously heated region. In one such approach the heating source may have a constant output.

In another approach, the heating is applied to discrete regions such that a newly heated region will melt and will also contribute heat to an adjacent previously heated region, and to which the source is no longer applied, to reduce a rate of cooling of the previously heated region.

The intensity of heating may be varied over time between a higher level used to initially melt a region and a lower level used to maintain the molten state. The level of heating may be decreased after melting a region until the region being heated overlaps an already molten region by less than a predetermined percentage. It is also possible to subject a region to refreezing and remelting to achieve required level of doping. However, ideally the remelting should occur no more than 3 times and preferably no more than once.

The heating may be achieved by scanning one or more laser beams over the surface of the semiconductor material such that a local region of irradiance by laser beam creates a melted region and scanning the laser over the surface progressively melts a continuous line of surface material. A continuous wave (cw) laser or a Q-switched laser may be used to heat the surface of the semiconductor material.

A laser beam may also be scanned over the surface of the semiconductor material in such a way that a local region of irradiance by laser beam creates a melted region and scanning the laser over the surface progressively melts adjacent such regions to form contiguous group of overlapping such regions. To achieve this a single Q-switched laser may be operated in a pulsed operation in which it emits multiple pulses each shorter than a maximum pulse duration of the Q-switched laser with the pulses irradiating overlapping regions of the semiconductor so as to simulate the effects of a cw laser.

In this arrangement the repetition period of the pulses will typically be less than 0.02 µs. The repetition period of the pulses may be constant to simulates an output of a constant irradiance cw laser or may be variable to simulate a variable irradiance cw laser.

Where a laser operated to have an output providing substantially constant level of irradiance on the surface being heated, or pulsed at a rate to simulate such an output, the scanning speed may then be chosen to melt the surface and to maintain a given point on the surface of the semiconductor material in a molten state for a period of at least 1 microsecond but no more than 10 microseconds.

In another approach, an average irradiance level of one or more laser beams impinging on a surface to locally heat the surface may be varied with time between at least a high average irradiance level periodically applied for a predetermined time period t1 to cause melting of unmelted semiconductor material on the surface of the semiconductor device within the time period t1 and a lower average irradiance level applied for a further time period t2 after the time period t1, the lower average irradiance level maintaining the melted semiconductor material in a molten state for the time period t2.

With a cw laser, the irradiance level may also be varied cyclically in synchronisation with the scanning speed such that the average irradiance level of the laser increases during a melting period and then decreases until the beam has moved over the surface sufficiently for less than a predetermined percentage of the beam to be still exposing molten semiconductor material. The period of the cyclic power variation may correspond to the beam width divided by the scanning speed and the higher output period may be 50% of the cycle or less.

It is desirable that during the lower irradiance period t2 the temperature of the molten semiconductor material is kept between 1414° C. and 3265° C. for at least one microsecond and preferably for 2-10 microseconds. The irradiance level of the laser may be varied by varying the output power of the laser, by varying the focus of the laser beam to spread the beam during the lower irradiance period t2, or when a Q-switched laser is used, by producing pulses in which the output varies with time such that each pulse has a high irradiance portion and a lower irradiance portion.

When variable irradiance is provided using a Q-switched laser which produces output pulses having variable power within the duration of the pulse, a first period of the pulse may have a power level which melts irradiated semiconductor material and a second period may have an output power that maintains irradiated melted semiconductor material in the molten state. During the second period the laser will preferably have an output power that does not ablate molten semiconductor material.

In one possible approach, the variable average irradiance is provided using a single Q-switched laser which is operated in a pulsed operation in which it emits multiple pulses each shorter than a maximum pulse duration of the Q-switched laser with the pulses irradiating overlapping regions of the semiconductor, the repetition period of the pulses being less than 0.02 µs and the repetition period being varied to simulate a variable output cw laser which produces a cyclic variable output. A higher average irradiance level may be produced by providing more closely spaced pulses the cyclic output having an average irradiance level during a first period of each cycle which melts irradiated semiconductor material and an average irradiance level during a second period of each cycle that maintains irradiated melted semiconductor material in the molten state. During the second period the laser will also preferably have an average output irradiance level that does not ablate molten semiconductor material within the period of illumination. Ideally the average output irradiance level during the second period will be such that it could be applied indefinitely without ablating molten semiconductor material.

The variable irradiance may also be provided using a cw laser which produces a cyclic variable output having a power level during a first period of each cycle which melts irradiated semiconductor material and a power level during a second period of each cycle that maintains irradiated melted semiconductor material in the molten state. Again during the second period the laser preferably has an output power that does not ablate molten semiconductor material.

More than one laser may be used to heat the semiconductor surface, in which case one laser may be used to melt the surface and a second laser may be used to maintain the temperature for a period sufficient to allow the dopant to be absorbed and mixed. Q-switched lasers may be used to heat the surface, or a first, Q-switched laser may be used to melt the semiconductor material with a pulse rate and scanning speed selected to allow overlapping exposed areas for consecutive pulses. In this arrangement, the pulses of the Q-switched laser may be of an intensity whereby the semiconductor material is melted with a single laser pulse and have a duration of less than 10% of the pulse repetition period. Each laser pulse may be overlapped with the previous pulse by 10-50% of the exposure area of the pulses. The second laser in this arrangement is only used to ensure that the semiconductor material remains molten between the pulses of the first laser for the required period of time and may be a cw laser operated with a constant output.

However, the second laser may also be a Q-switched laser, in which case the second laser may operate to produce output pulses in periods between the pulses of the first laser and at a lower irradiance than the first laser to extend the time during which semiconductor material melted by the first laser remains molten. The second laser may be operated in a pulsed operation in which it emits multiple pulses each shorter than a maximum pulse duration of the Q-switched laser with the pulses irradiating overlapping regions of the semiconductor, the repetition period of the pulses being less than 0.02 µs and the repetition period being constant, to simulate a constant output cw laser at least during the period between the pulses of the first laser.

The area to be doped may comprise the entire surface of the semiconductor device to create a surface emitter layer. However, more typically this general method is used to dope a part of an entire surface where contacts are to be formed on an illuminated surface of a solar cell. The method is typically used with silicon material although it is equally applicable to other semiconductor materials.

The period within which the surface of the silicon material may be maintained in a molten state when applying the above methods will be preferably a period which permits substantially uniform distribution of the dopant throughout the molten semiconductor material. Alternatively the period within which the surface of the silicon material may be maintained in a molten state may be a period which permits all of the molten region to achieve the same overall dopant polarity.

The laser doping process for a silicon wafer involves melting localised surface regions of the wafer in the presence of either n-type or p-type dopants, so that the dopants are incorporated into the molten region. The dopants may be included within a surface dielectric layer, they may be applied as a coating on top of or below the dielectric layer (also potentially the antireflection coating), they may be present in the silicon at interstitial sites in an unactivated state whereby they are absorbed into the silicon structure (or activated) when the silicon crystallizes in the melting and refreezing process or they may be applied to the region in gaseous or liquid form whilst the silicon is molten.

A multi-layer anti-reflection coating for a solar cell is provided wherein the solar cell includes a semiconductor material structure in which a junction is formed, the anti-reflection coating being located on a light receiving surface of the semiconductor material structure and comprising a thin layer of thermal expansion mismatch correction material having a thermal expansion coefficient less than or equal to that of the semiconductor material, to provide thermal expansion coefficient mismatch correction; and an anti-reflection layer having a refractive index and thickness selected to match the semiconductor material structure so as to give good overall antireflection properties to the solar cell.

A method of fabricating a multi-layer anti-reflection coating for a solar cell is also provided wherein the solar cell includes a semiconductor material structure in which a junction is formed, the anti-reflection coating being formed on a light receiving surface of the semiconductor material structure and the method comprising forming a thin layer of thermal expansion mismatch correction material having a thermal expansion coefficient less than or equal to that of the semiconductor material, to provide thermal expansion coefficient mismatch correction; and forming an anti-reflection layer under or over the thermal expansion mismatch correction material, the anti-reflection layer being selected to have a refractive index and thickness which matches the anti-reflection layer to the semiconductor material structure so as to give good overall antireflection properties to the solar cell.

The proposed multilayer anti-reflection coating is preferably applied to a crystalline (including multicrystalline) silicon based device but may also be applied to devices based on other semiconductor types in which case the thermal expansion mismatch correction material will be selected to match the thermal co-efficient of expansion of the particular semiconductor material.

The thermal expansion mismatch correction material will be formed, in one embodiment, after surface passivation (if applied) and before the anti-reflection layer. However in another proposed embodiment a conventional SLARC is applied followed by a thermal expansion mismatch correction material layer of similar or greater thickness to the SLARC and having a refractive index matched to a subsequently formed encapsulation layer.

When applied before the anti-reflection layer, the thermal expansion mismatch correction material layer is preferably at least as thick as the passivation layer (if used) but not as thick as the anti-reflection layer. With PECVD it is possible to tailor this layer in terms of having a graded composition and refractive index to further aid with the optimisation. The inclusion of some nitrogen allows silicon oxynitrides of virtually any refractive index from below 1.5 to above 2 to be achieved.

When the thermal expansion mismatch correction material layer is applied after the anti-reflection layer, the DLARC is preferably quite standard (to achieve surface passivation and good antireflection properties), and the expansion mismatch correction material layer is formed with a thermal expansion coefficient less than silicon but with optical properties matched to the encapsulant (i.e. refractive index of about 1.5) so as not to degrade the antireflection properties of the solar cell when encapsulated. This additional layer may be of silicon dioxide or silicon oxynitride and needs to be quite thick (at least as thick as the silicon nitride anti-reflection layer) to provide adequate thermal expansion mismatch correction.

The front surface region of the semiconductor material structure may be passivated by a surface treatment of its light receiving surface. The passivation treatment may comprise a surface diffusion of the semiconductor material or a surface coating such as a very thin dielectric layer. Passivation may also be achieved by selecting a thermal expansion mismatch correction material having or modified to have passivation qualities.

For a crystalline silicon based solar cell the passivation treatment may comprise a thin silicon nitride layer in the range of 10-200 angstrom thick, the thermal expansion mismatch correction layer may comprise a layer of silicon dioxide or silicon oxynitride in the range of 100-300 angstroms thick and the anti-reflection layer may comprise a layer of silicon nitride in the range of 300-800 angstroms.

The multiple layer coating may also act as a dopant source during a front surface laser doping process by incorporating dopants into one of the layers being already used for providing one or more of the functions above. Alternatively an additional dopant source layer can be formed with refractive index of approximately 1.5 so as to optically match to the material to be used as encapsulant for the solar cells during module formation.

In the case of the expansion mismatch correction material layer being formed over the SLARC, the expansion mismatch correction material layer may simultaneously also be a dopant source for doping of the heavily doped regions of a contact structure. In this case, the additional expansion mismatch correction material/dopant source layer may be removed prior to encapsulation if desired. The anti-reflection layer in this case may be a layer of silicon nitride in the range of 300-800 angstroms, and the thermal expansion mismatch correction layer may be a layer of silicon dioxide or silicon oxynitride in the range of 300 angstroms to 1 micron thick with a refractive index in the range of 1.5-1.6. This arrangement provides a new option where an additional material is added on top specifically for the high temperature treatments (such as laser doping) to give the thermal expansion mismatch correction but can then be optionally removed prior to cell completion so as not to interfere with the optical properties.

A wide range of deposition approaches such as PECVD, sputtering or evaporation may be used to apply the passivation/thermal expansion mismatch correction/anti-refection layers. A wide range in the number of layers and their dimensions and refractive indices could also be used. For example a portion of the deposition of the anti-reflection coating may be applied for the purpose of providing the thermal expansion mismatch correction, in which case a portion may be applied for the purpose of passivating the semiconductor surface and/or bulk while a portion is deposited to provide the overall anti-reflection coating with the desired optical properties of reduced reflection.

The proposed multilayer thermal expansion mismatch correction layer may be applied to a non light-receiving surface which therefore eliminates the need for the overlying anti-reflection layer.

The proposed multilayer anti-reflection coating may be applied to a surface so that the anti-reflection coating can also perform additional functions such as acting as a plating mask or a diffusion mask. Where additional functions such as these need to also be performed, it is often feasible to incorporate the necessary properties into one of the existing layers by appropriately varying the chemistry of the layer or its thickness or alternatively by incorporating one or more additional layers to provide the additional functions.

The proposed multilayer anti-reflection coating may be used with a range of surface structures including textured surfaces and the density of defects generated due to thermal expansion mismatch can be dependent upon this surface geometry. Never-the-less, regardless of the surface geometry, the multilayer anti-reflection coating can be applied so as to significantly reduce the generation of defects during thermal processes.

BRIEF DESCRIPTION OF THE DRAWINGS

Embodiments of the invention will now be described with reference to the accompany drawings in which.

FABRICATION USING CONTROLLED HEATING

Figure 1:
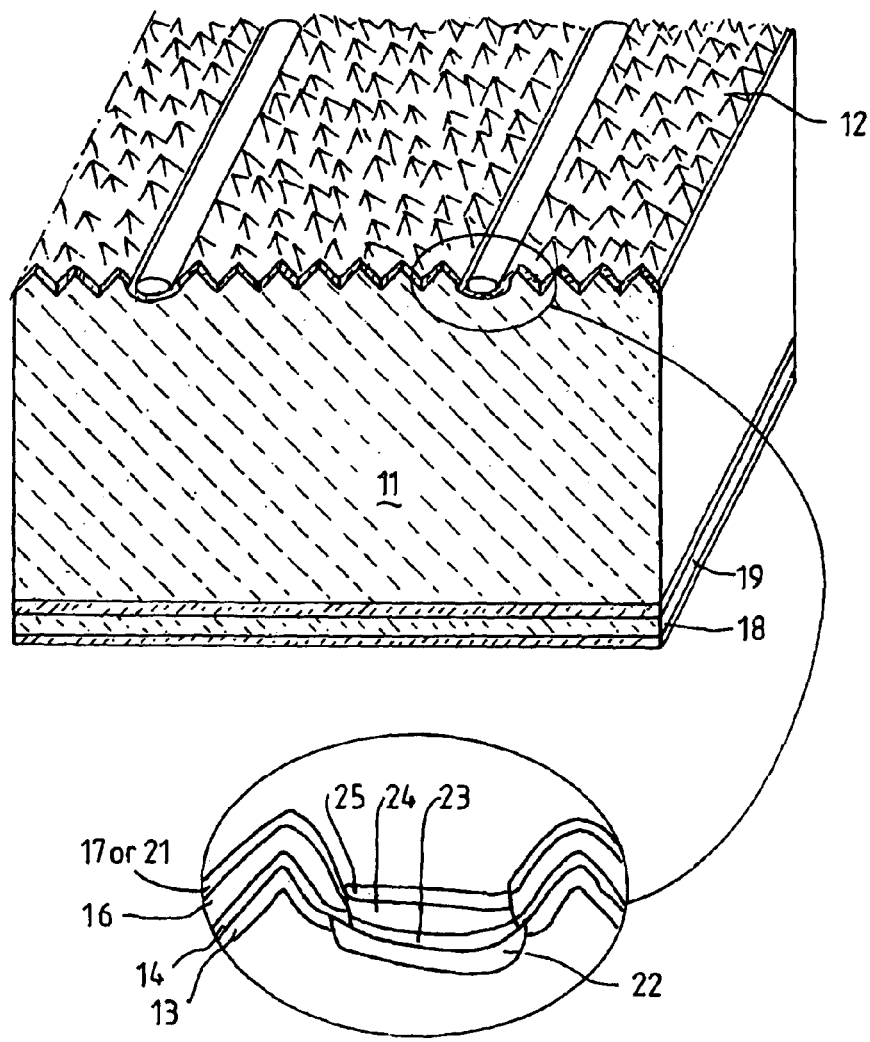
FIG. 1 illustrates a Solar cell with a selective emitter structure and metal contact formed in self-aligned method following the laser doping of the heavily doped regions beneath the metal contact. The manufacture of this solar cell may also incorporate one of the improved laser operation methods described herein.

By way of example, and with reference to FIG. 1, a suitable fabrication sequence for the formation of a silicon solar cell is as follows:

1. Isotropic texturing 12 of the front (or light receiving) surface of the p-type wafer 11;
2. front surface diffusion of n-type dopant 13;
3. edge junction isolation/psg removal;
4. ARC deposition on the front surface by PECVD;
    a. 100 angstroms of hydrogen rich silicon nitride specifically for surface passivation 14;
    c. 600 angstroms of silicon nitride 16 of refractive index 2.0-2.1;
    d. dopant containing layer 17;
5. screen-print rear (non-light receiving) surface with aluminium for rear contact 18;
6. fire rear surface to sinter rear contacts 18 and form back surface field 19 by formation of aluminium/silicon alloy and liquid phase epitaxy;
7. laser doping of silicon in localised regions to form heavily doped (n+) regions 22 for formation of self-aligned front surface metal contacts;
8. Plating a layer of Nickel 23 over the laser doped n+ regions 22 for the front surface contacts;
9. sintering of Nickel 23;
10. plating of layers of Copper 24 and Tin 25 (or Silver) over the Nickel 23;

The above processing sequence produces the high performance solar cell structure of FIG. 1 with a selective emitter that provides heavy doping of the silicon directly beneath the metal contacts. The presently proposed controlled laser heating method may be used in conjunction with this manufacturing sequence to reduce the formation of defects in the region of the contacts.

Improved heating regimes can be effected by a uniquely designed laser Q-switching arrangement or by a scanning continuous wave laser with appropriate power level, to melt the silicon for adequate duration to facilitate dopant mixing while simultaneously avoiding unnecessary thermal cycling of the melted regions or ablation of the doped silicon. Q-switched laser systems or directly applied continuous wave lasers operated in the conventional manner are unable to heat and melt the silicon in the required way.

Figure 2:
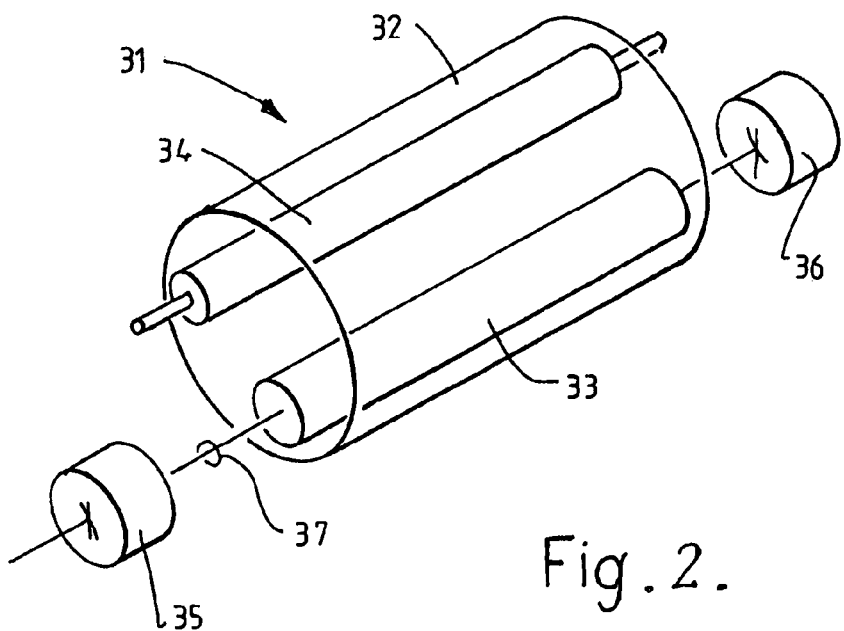
FIG. 2 schematically illustrates the major components of an optically pumped solid-state laser oscillator.

FIG. 2 shows the major components of an optically pumped solid-state laser oscillator 31. A pump cavity 32 contains a laser rod 33 and a pump lamp 34. The laser rod 33 is a semiconductor material such as a Neodinium:YAG crystal, which when illuminated by the pump lamp 34, leads to the excitation of large numbers of electrons N into high energy levels (inversion). Continued illumination of the laser rod 33 by the lamp 34 causes N to increase until the generation rate of exciting additional electrons is balanced by the spontaneous recombination rate for the excited electrons which occurs predominantly by radiative recombination at 1.064 micron wavelength light in Nd:YAG laser rods or 532 nm if operating in frequency doubled mode. The basis of lasing action is a process known as "stimulated emission" where the recombination of an excited electron is triggered by an incident photon. In this process, the emitted photon is indistinguishable from the incident photon triggering the stimulated emission. It has the same wavelength of 1.064 microns (or 532 nm when frequency doubled), travels in the identical direction and has the same phase. This process can be used in conjunction with the mirrors 35 and 36 shown in FIG. 2 to form an optical resonator with laser oscillations. The mirrors 35, 36 are mounted parallel to each other and perpendicular to the axis of the laser rod 33, so that if a spontaneously emitted photon fortuitously travels in line with the laser rod's axis, it is reflected back into the laser crystal by the respective mirror 35 or 36, providing the opportunity for stimulated emission and the generation of multiple photons all of the same wavelength, phase and direction. This gives rise to the potential for amplification if the gain is above unity, leading to an increase in the number of photons within the optical cavity 11. These are then reflected by the other mirror 36 or 35, again back along the axis 17 of the laser rod and into the laser crystal. These laser oscillations continue to increase the photon flux for as long as the gain remains above unity, where the gain is determined by the number of electrons in their excited (inverted) state, the stimulated emission process and the cross-section of the laser rod volume.

Steady State Continuous Wave Laser Operation

In steady state, the gain will be unity with the rate at which new photons are emitted by the laser crystal exactly balancing the total optical losses from the optical cavity. The major optical loss from the cavity is via the mirror 35 at the output end of the laser which is deliberately partly transmissive to allow the laser beam to escape. This mode of laser operation is known as continuous wave since the laser beam is delivered continuously from the optical resonator.

For a given laser rod 33, optical cavity 32 and pumping lamp power, this steady state operation of the laser corresponds to a "threshold" population inversion density of electrons in their excited state $N_{th}$. For $N>N_{th}$, the gain will exceed unity leading to an increase in the laser oscillations and photon flux which will in turn cause an increase in the stimulated emission and a corresponding lowering of the number of electrons in their excited state N. Similarly, if $N<N_{th}$, the gain is below unity and less than the steady state value of stimulated emission occurs, leading to the generation rate of excited electrons due to the pumping lamp exceeding the recombination rate determined by the stimulated emission, and so N increases.

Q-Switched Laser Operation

Q-switching is a mode of laser operation extensively used for the generation of high power pulses that makes it easier to melt the silicon during the laser doping process. Energy is effectively accumulated and stored for a period of time in the laser crystal and then used to form a very high energy laser pulse that is emitted from the laser in an extremely short period of time, therefore providing extremely high power densities. The energy is accumulated and stored in the laser crystal by deliberately creating optical losses within the optical cavity to retard stimulated emission and therefore prevent lasing action. This allows the generation rate of excited electrons to greatly exceed the recombination rate, therefore allowing N to greatly exceed $N_{th}$. This state of the laser crystal is known as "population inversion". Subsequent elimination of the optical loss from the optical cavity allows stimulated emission to again occur and the photon flux in the optical cavity increases exponentially until N is sufficiently depleted to retard significant further radiative recombination. This leads to the emission of a very high energy pulse from the laser, following which few electrons remain in their excited state with N falling to way below $N_{th}$ and the gain falls to well below unity.

Figure 3:
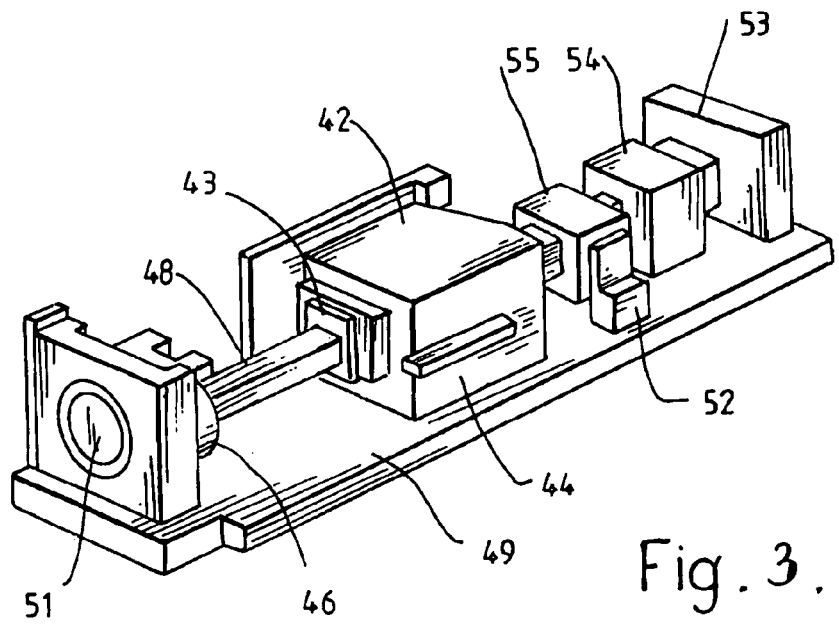
FIG. 3 is a photograph of an Optical Cavity of a Quantronix™ series 100 Nd:YAG laser.
Figure 4:
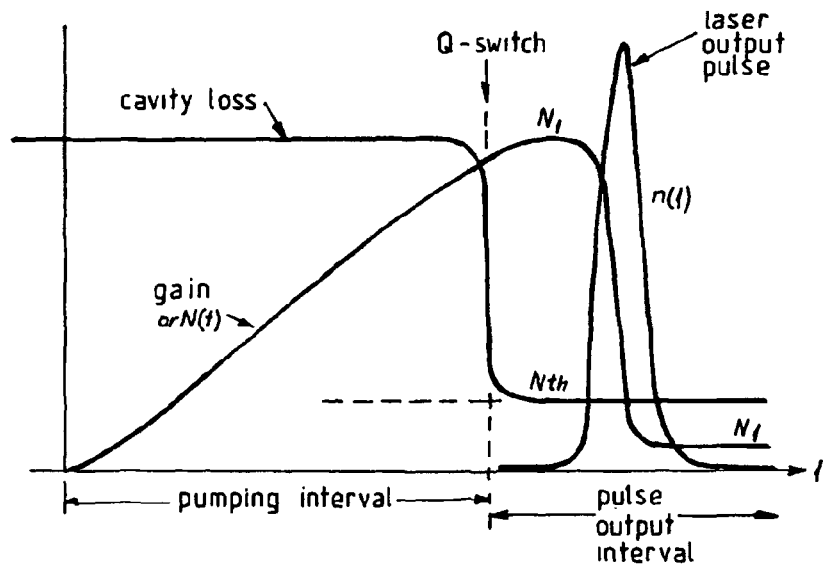
FIG. 4 graphically illustrates Cavity losses, gain and laser energy output w.r.t. time for a Q-switched laser.

Introducing the optical loss into the optical resonator is often referred to as lowering the quality factor Q, where Q is defined as the ratio of the energy stored in the optical cavity to the energy loss per cycle. FIG. 3 shows a photo of the optical cavity of a Nd:YAG series 100 Quantronix™ laser 41, showing a flooded optical pump cavity 42, enclosing a Nd:YAG crystal assembly 43 and krypton arc pumping lamp assembly 44. The beam passes from the crystal assembly to one mirror assembly 46 via a beam tube and bellows 48 mounted on rail 49. Mirror adjustments 51 provide alignment of the beam axis to the mirror 46. Q-switch Bragg angle adjustment 52 a mode selector 53 and an intercavity safety shutter 54 are provided at the output end of the optical path. In this case, the Q-switch 55 is a prism through which the laser beam passes. Electrodes mounted on the prism allow a high powered RF signal to be applied to the prism which causes the laser beam to deviate and therefore create optical losses. FIG. 4 shows how control of the quality factor can be used to generate the high energy pulses and how N changes throughout. When considering laser doping, it turns out that a severe limitation of Q-switched lasers is the fact that following the generation of each high energy pulse, N falls to such low values (well below $N_{th}$) due to stimulation emission from the very high photon flux in the optical cavity, that minimal lasing action is feasible until N has returned to well above Nth. This takes too long from the perspective of laser doping since the molten silicon being doped re-solidifies during this period.

Laser Doping Process

The laser doping process for a silicon wafer involves melting localised surface regions of the wafer in the presence of either n-type or p-type dopants, so that the dopants are incorporated into the molten region. Referring to FIG. 1, this facilitates the formation of a selective emitter structure with the heavily doped regions 22 self-aligned to the overlying metal contact 23, 24, 25. The dopants can be included within a surface dielectric layer 17, be applied as a coating on top of or below the dielectric layer (also potentially the antireflection coating 16), they may be present in the silicon in an unactivated state whereby they are absorbed into the silicon structure (or activated) by the melting and refreezing process or they may be applied to the region in gaseous or liquid form whilst the silicon is molten (described below with reference to FIGS. 12 and 13). Referring to the FIG. 1 example, to use laser doping in conjunction with subsequently forming self aligned metal contacts 23, 24, 25 onto the highly doped laser melted regions 22, the silicon surface is coated with a dielectric layer 17 that protects the unmelted regions from the subsequent metal contact formation process as taught by Wenham and Green, U.S. Pat. No. 6,429,037. The laser doping process automatically destroys the overlying dielectric layer in the laser doped regions, therefore exposing the silicon surface for subsequent metal contact formation which can be done in a self-aligned process such as via metal plating. The dielectric layer or layers can include an antireflection coating 16, surface passivation layer 14, dopant source 17, hydrogen source (not shown) for surface and/or grain boundary and/or defect passivation, protection layer (also not shown) for the silicon surface and/or plating mask, or one or more layers which potentially in combination or singly perform one or more of these functions.

The dopant source may also be incorporated within the silicon itself, rather than in a separate layer or coating. In other words, the laser may be used to locally melt the silicon that is already loaded with dopant such that the melting and refreezing process causes the free dopants (commonly referred to as interstitial atoms which are electrically inactive dopants that are not bonded normally within the silicon lattice) to be absorbed into the crystalline silicon structure (lattice) and redistributed from original location. For example when an n-type dopant is thermally diffused into the surface of the silicon in an emitter forming step, many more n-type dopant atoms may be diffused into the silicon than actually become electrically active. Laser melting can then be used to allow these extra dopant atoms to redistribute themselves and become active within the silicon to form more heavily doped contact regions.

The number of inactive dopants that will be present within the silicon (e.g. within the diffused n-type emitter) is determined by the way in which the diffusion is done. Often when diffusing dopant into a surface it will be done it in a way that attempts to keep the surface concentration of the dopant (e.g phosphorus (P)) below the solid solubility of the dopant in Silicon, for the particular temperature at which the processing is being performed, to avoid the inclusion of too many inactive dopants. One way of avoiding excessive dopant atoms in the silicon, for example, is by diffusing through a silicon dioxide layer (most common approach) although another very common approach is simply to reduce the concentration of the dopant source.

By deliberately allowing the surface dopant concentration (e.g. phosphorous) to go above the solid solubility of the dopant in silicon, whereby large numbers of inactive dopants are incorporated into the surface, these inactive dopants can become the source of dopants for the laser doping process. Typically the emitter will be formed with a sheet resistivity in the range of 80-200 ohms per square. By incorporating a large number of inactive dopants, the sheet resistivity can be reduced by at least a factor of two in the areas treated by the laser compared to the areas not treated by the laser. For example, if the emitter is formed with a preferred emitter sheet resistivity of 100 ohms per square, this can be made to drop to about 30-40 ohms per square in areas melted by the laser. This level of sheet resistivity is sufficient for good performance but optimisation of the process may provide even better results.

Problem with Conventional Q-Switched or Continuous Wave Lasers

Figure 6:
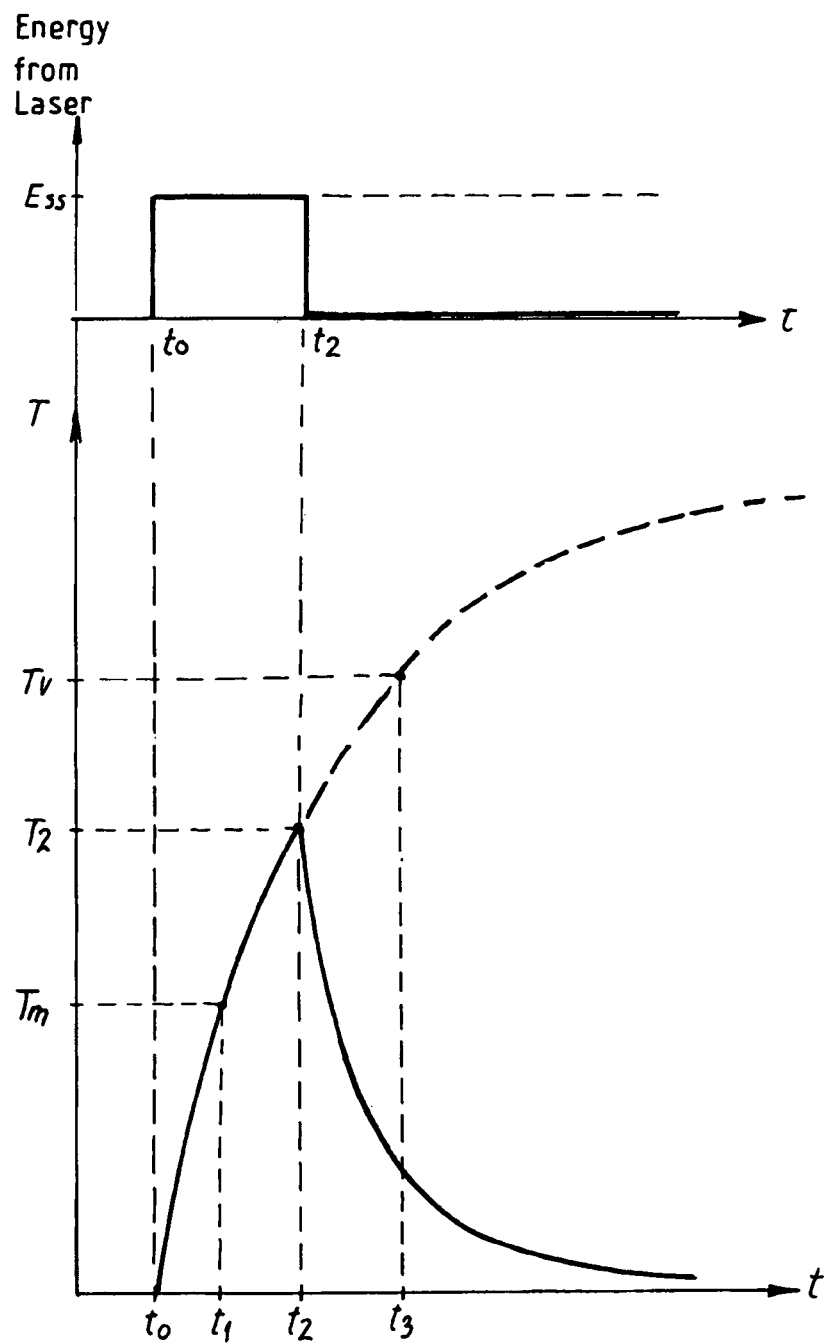
FIG. 6 graphically illustrates the heating effect of a laser pulse on silicon.

A particular challenge with the above process arises due to limitations imposed by conventional Q-switched or continuous wave (cw) lasers in steady state. In a continuous wave laser in steady state, it is difficult to melt the silicon and then hold it molten for sufficient duration to ensure mixing of the dopants and then stop the energy flow from the laser before ablating some of the silicon. This is because in general if there is sufficient energy in the beam to melt the silicon within a reasonable period of time (at approximately 1400 degrees Celsius), then during the subsequent 2-10 microseconds that the silicon needs to remain molten for the dopant mixing, the constant delivery of the laser energy from the cw beam into the molten region during this period is likely to heat the silicon to above its vaporisation temperature $T_v$ as shown in FIG. 6. In FIG. 6, the unacceptable scenario is shown in the dotted curve where the silicon is heated to well above the vaporisation temperature $T_v$ when the cw laser in steady state with energy $E_{ss}$ is applied to a specific location. To avoid the unacceptable ablation of silicon, either the energy $E_{ss}$ has to be reduced sufficiently so that the highest temperature $T_u$ that the silicon reaches is still below the ablation temperature $T_v$, or else the application of the laser beam to this location has to cease by time $t_2$ as shown by the solid curve in FIG. 6 so the silicon only heats to temperature $T_2$ before being allowed to cool. It is difficult with a cw laser in steady state to keep applying and then ceasing the application of the laser beam in this way because of problems such as transient effects in the laser output and the laser operation. Even if the cw laser could be applied and stopped in this way, the energy level $E_{ss}$ and timing would also have to be such that the time period between $t_1$ (the time at which the silicon melts) and $t_2$ (when the laser beam ceases) would need to be at least 2 microseconds or else the silicon will not remain molten long enough for the dopants to properly mix. Pseudo continuous wave lasers which typically work at pulse frequencies well above 10 MHz, have the same problem whereby the energy pulses are so close together that from the silicon's perspective, it behaves similarly to a cw laser since the silicon does not have sufficient time between the pulses to significantly change temperature.

Conventional Q-switched lasers also cause problems with the laser doping process. This is because the pulses are too short and too far apart. Pulse durations are usually well below 1 microsecond, leading to the silicon remaining molten for typically no more than a microsecond, which is insufficient for adequate dopant mixing. To compensate for this, many overlapping pulses are therefore typically needed at each location to melt the silicon enough times so that the cumulative effect provides sufficient time in the molten state for adequate dopant mixing. This however introduces another problem relating to the thermal cycling. The duration between pulses in these Q-switched lasers is sufficiently long (usually at least several microseconds) that the silicon resolidifies between pulses. This cycling creates significant stress on the silicon leading to defect generation, particularly in the regions immediately adjacent to the areas melted, exacerbated by the thermal expansion coefficient mismatch between the silicon and the antireflection coating which in general is silicon nitride. Each additional pulse at each location reheats the solid silicon immediately next to the molten region to a temperature close to the melting temperature for silicon. At these temperatures, the higher thermal expansion coefficient of the silicon nitride (or any other layer with thermal expansion coefficient above that of silicon), leads to it placing the silicon surface under tension. Under these conditions, the silicon is particularly weak and vulnerable to defect generation. The more of these cycles the silicon sustains, the worse apparently is the defect generation. Consequently there is a fundamental weakness and trade-off with this type of laser whereby insufficient pulses at each location leads to improper dopant mixing but not too many defects, while additional pulses facilitates better dopant mixing but increased defect generation.

Considerable research has been conducted in various institutions and/or companies in recent years addressing this problem associated with laser doping. Unfortunately, the solutions found have not been practical for the commercial production of laser doped solar cells. One solution has been to replace the silicon nitride ARC with a silicon dioxide layer that has lower thermal expansion coefficient than silicon. The use of such a layer when heated to the vicinity of the melting temperature for silicon, places the silicon surface under compression, therefore avoiding defect generation. Good electrical performance has been achieved from devices fabricated with this approach with the achievement of fill factors above 80% indicating that junction recombination due to defects has been reduced to insignificant levels. This approach is not however practical for commercial devices, firstly because the lower quality of commercial grade substrates relies heavily on hydrogenation from the silicon nitride layer to passivate defects and grain boundaries, secondly because silicon dioxide layer has too low a refractive index to be effective as an antireflection coating, and thirdly, the thermal growth process for such oxide layers is not practical for commercial devices.

A modified approach of using a thin interfacial oxide layer sandwiched between the silicon surface and the silicon nitride ARC has solved some of the above limitations while still facilitating the avoidance of the defect generation and hence the achievement of high fill factors. The optical performance of the ARC combination was only marginally below that of the straight silicon nitride ARC, while the practicalities of growing a thin oxide layer (150-200 angstroms) industrially are greatly superior to having to grow an oxide layer of ARC thickness (1100 angstroms). The main drawback however, in addition to the increased cost and complexity of having to grow the thin oxide layer, is the inability to hydrogenate (passivate) defects and grain boundaries through such an oxide layer.

Improved Regime for Heating and Melting the Silicon

Figure 5:
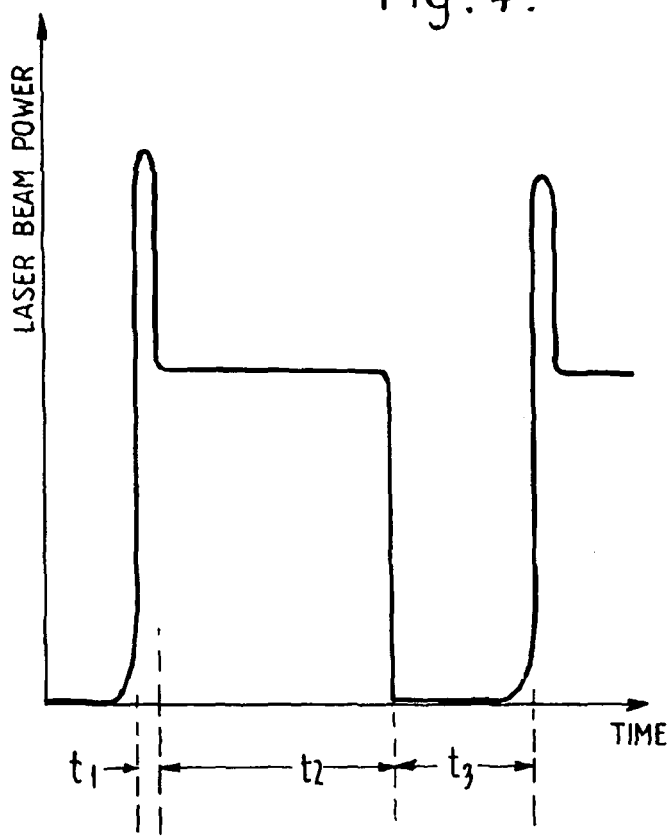
FIG. 5 graphically illustrates an example of a laser beam power versus time profile for laser pulses to improve the laser doping of silicon (times not drawn to scale)

To improve the quality of the laser doping process as part of forming a self-aligned metal contact, the silicon needs to be heated in a different manner to the way it has been previously done with conventional laser systems. Following melting to incorporate the dopants into the silicon, heat needs to be continuously applied to the molten region for time $t_2$ (see FIG. 5) so as to keep the temperature approximately constant for at least one microsecond and preferably for 2-10 microseconds. This is to allow adequate time for the dopants to redistribute uniformly throughout the molten region while simultaneously keeping the molten volume approximately constant which is not possible if the temperature is changing. To achieve this, the power received from the laser in a given location needs to vary with time as shown in FIG. 5 where the initial high powered region of the pulse of duration $t_1$ is required to quickly melt the silicon while the lower powered tail needs to be of the right duration $t_2$ and power level so as to keep the molten region at approximately constant temperature for the required duration. Of particular importance is that the silicon remains molten for up to 2-10 microseconds to ensure adequate quantities of dopants are incorporated into the molten region and that these dopants are properly mixed within the molten silicon. This process simultaneously exposes the heavily doped silicon surface by destroying the overlying dielectric layer (usually silicon nitride). This facilitates the subsequent formation of a metal contact such as through the direct plating of metal to these heavily doped regions. This process can therefore lead to the formation of a selective emitter whereby the low area metal contact formed via the laser doping process is automatically self aligned to the heavily doped regions as shown in FIG. 1.

A solution for laser doping of silicon is to deliver the laser pulse with its energy as a function of time as shown in FIG. 5, whereby the initial peak in energy is for sufficient duration $t_1$ to heat the silicon to its melting point, while the subsequent and much longer part of the pulse is at a much lower energy level that continues for several microseconds and is at an energy intensity that keeps the molten silicon at approximately a constant temperature. At the end of the pulse, the laser energy falls for period $t_3$, allowing the silicon to cool and solidify until the next laser pulse arrives. Ideally, the frequency of these pulses $F_{pulses}$, in conjunction with the scanning speed of the laser beam $V_{scan}$, are chosen so that the distance traveled by the scanning beam in the time $1/(F_{pulses})$ is within the range of 50-100% of the beam diameter. This ensures the laser doping forms a continuous line but prevents excessive overlap between adjacent pulses so that none of the silicon is melted more than twice so as to avoid excessive thermal cycling. For example, if $V_{scan}$ is 1 m/s and the frequency 100 kHz, then the laser beam moves 10 microns relative to the silicon surface in the time between the commencement of juxtaposed pulses. This represents approximately 67% of the typical beam diameter which is approximately 15 microns.

One approach to achieving this outcome is to superimpose two laser beams on top of each other whereby one is Q-switched at the desired pulse frequency with a power per pulse close to that required to melt the silicon while the second laser operates on continuous wave steady state mode, providing an energy level appropriate to keep the molten silicon at approximately a constant temperature. The latter laser power is too low to melt the silicon in the time each location is exposed to the laser (or if it does melt the silicon, the time taken is too long so that the silicon does not then remain molten for long enough). However superimposing the Q-switched laser pulses from another laser (with independent optical cavity) allows the silicon to be quickly heated to the right temperature for melting, following which the low powered cw laser provides sufficient energy to keep the silicon molten. In this regime though, some overlap between juxtaposed laser pulses is necessary as the beam is scanned across the wafer surface to ensure continuity in the melted and doped regions. This can be a problem since the melted silicon from one pulse still remains molten when the next pulse arrives due to the low powered laser keeping its temperature constant, with subsequent overlap with the next Q-switched pulse therefore in danger of causing the already molten silicon to reach its vaporisation temperature. It seems a small amount of ablation is therefore inevitable with this approach although it is still a significant improvement over laser doping done with conventional Q-switched or continuous wave lasers. Ideally, the low powered cw laser needs to have its power reduced or stopped briefly before the next Q-switched pulse arrives so as to allow the silicon to cool somewhat. Although laser systems can in theory be configured to work in this way, in reality, difficulties in aligning the two lasers make it unreliable at best and unworkable at worst.

Another approach involves controlling the Q of a Q-switched laser which can in theory facilitate the formation of laser pulses with power as a function of time as shown in FIG. 5. In normal Q-switched lasers this is not an existing capability since the loss introduced into the optical cavity is binary in nature with only two discrete levels, one causing the Q to be high (low loss) so the laser gain is high and one causing the Q to be low (high loss) so that the gain is low. With a specially designed arrangement for controlling the Q of the cavity with infinitely variable Q values, it becomes theoretically possible to construct power versus time profiles for the energy pulses as shown in FIG. 5 where the initial high energy region is of the right peak power level and duration to melt the silicon, the tail is also of the right power level and duration so as to keep the molten region at approximately a constant temperature for the time needed for adequate dopant mixing, followed by a brief period at much lower energy level that allows the silicon to cool sufficiently before the next laser pulse arrives. The overall timing and frequency of the pulses is chosen so as to give the desired level of overlap between juxtaposed pulses.

Figure 7:
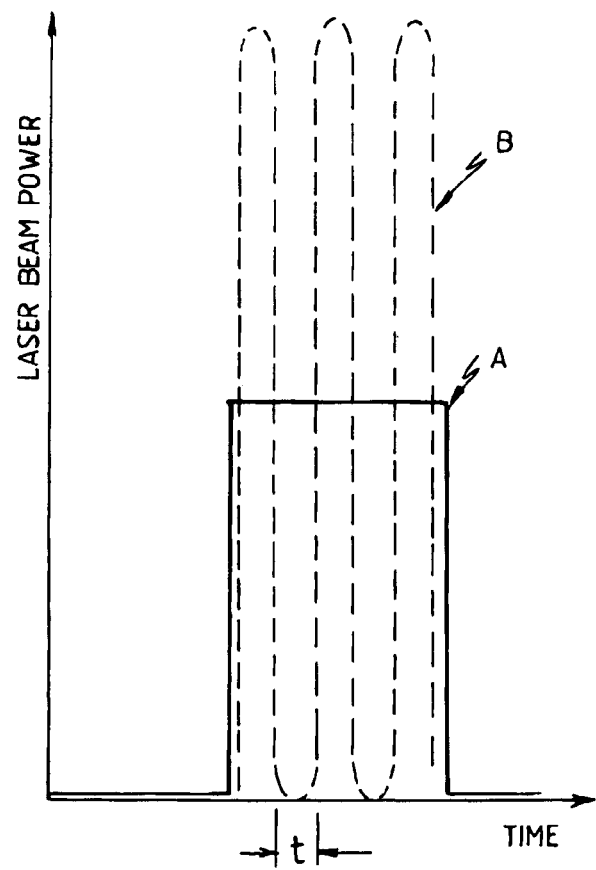
FIG. 7 graphically illustrates two power versus time profiles A and B for the laser output which are equivalent from the silicon's perspective provided t<<1 microsecond and provided the cumulative energy delivered to the silicon is the same in both cases.

Another approach for achieving the equivalent of the previous approach above is through synthesizing the power versus time profile with a sequence of closely spaced pulses (of much lower energy content than normal Q-switched pulses) which when "filtered" to remove the highest harmonics produces the power versus time profile of FIG. 5. This can be done using a more conventional Q-switching arrangement of only introducing loss into the optical cavity in a binary fashion whereby the loss level is only either high or low, but is applied in a more controlled fashion with regard to the length of time for which the loss is applied. When a Q-switched pulse is to be generated, the deliberately applied loss to the optical cavity is removed, therefore allowing stimulated emission and the generation of a high energy pulse. If the loss is reapplied quickly enough partway through the generation of a pulse, the number of electrons N in the excited state can remain in the vicinity of Nth or above, therefore making it feasible to generate another pulse almost immediately. A series of much smaller pulses over a longer period of time can therefore be generated instead of a single short high energy pulse following which N falls to negligible values. When applying such a sequence of energy pulses to silicon, provided the period between pulses is short enough (well under a nanosecond), the limited thermal conductivity of the silicon means that it is simply the amount of energy delivered to the silicon by the laser pulses collectively rather than the actual form it takes (i.e. power versus time relationship) that is important. For example, from the perspective of the silicon being melted, the two forms of laser output shown in FIG. 7 are equivalent provided "t" is well under a nanosecond. By virtue of this "filtering" function performed by the silicon, this makes it possible to synthesize virtually any desired laser output as a function of a large number of small pulses closely spaced in time.

Figure 12:
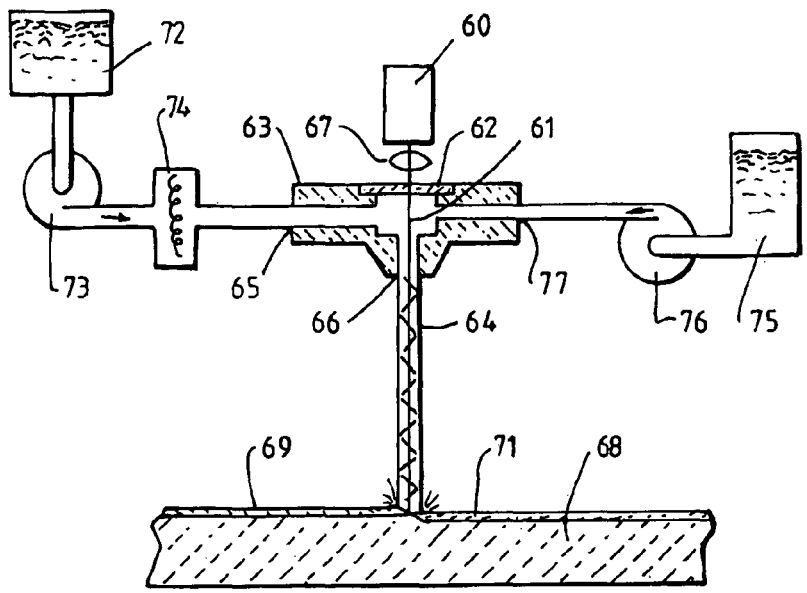
FIG. 12 schematically illustrates the arrangement of a laser and liquid jet when used to process a surface of a target.

To achieve control of the size of each of the small pulses described above, feedback linked to the photon flux in the optical cavity can be used so that when this photon flux reaches a specific level during the formation of a Q-switched pulse, loss can be reintroduced into the optical cavity to prevent further stimulated emission and therefore preventing the formation of the remainder of the high energy pulse that would otherwise eventuate. Referring to FIG. 12, one way this feedback can be applied is via the use of a slightly transmissive mirror on the non-output end of the optical cavity with a photosensitive device such as a solar cell able to measure the intensity of the light escaping through the mirror which is in turn proportional to the photon flux in the optical cavity. The measurement of this light intensity can be used to determine the time at which the loss should be reapplied to the optical cavity.

Figure 8:
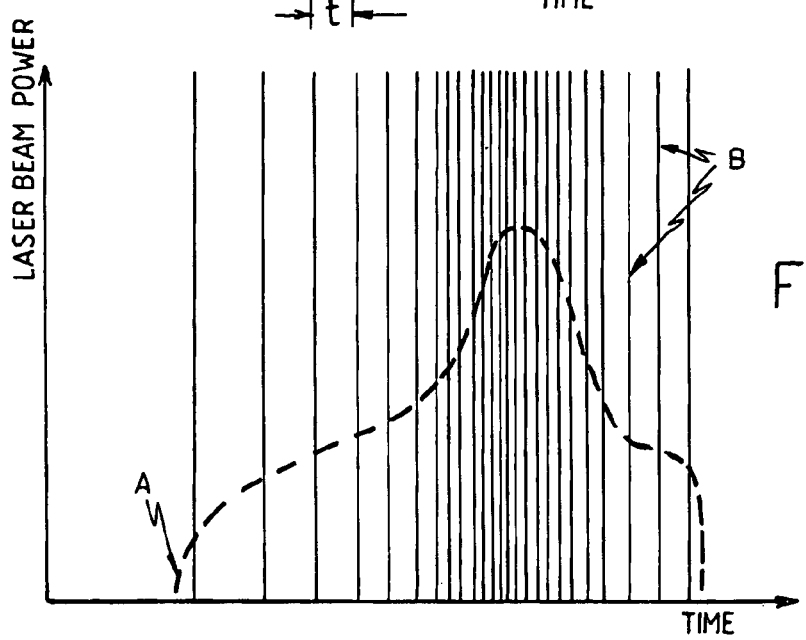
FIG. 8 graphically illustrates a Power versus time profile (curve A) which in curve B is equivalently synthesized by a sequence of short high energy pulses with time varying separation.

As an example of this approach, curve A of FIG. 8 can be equivalently synthesized by the series of short pulses shown in curve B of FIG. 8.

Figure 9:
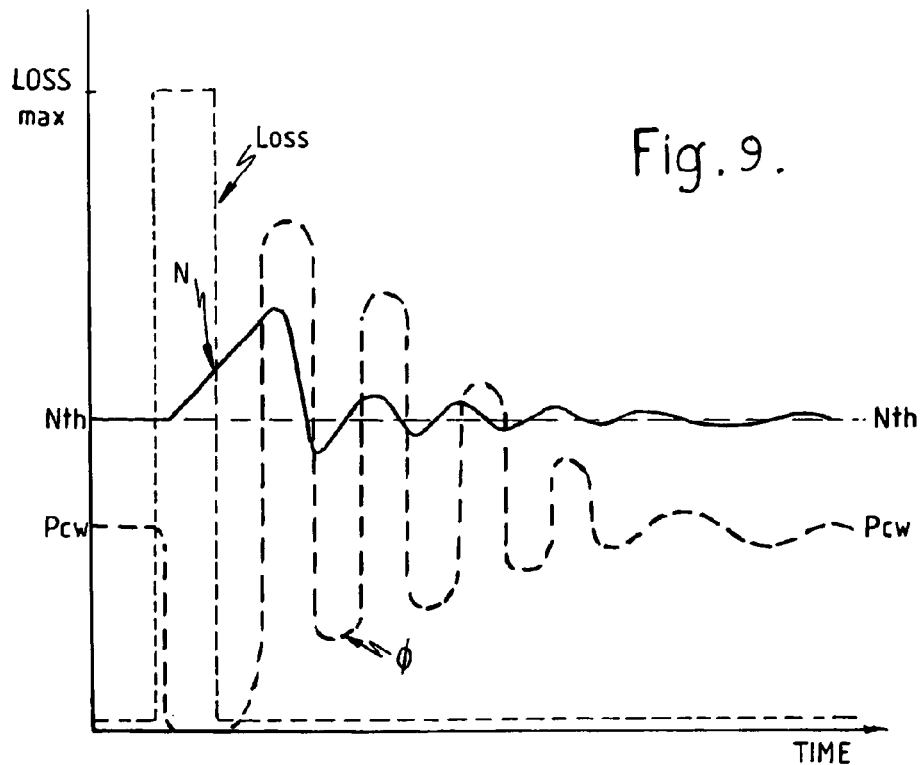
FIG. 9 graphically illustrates a variation of electron density in excited states N and photon flux during the transient behaviour that follows briefly after introducing loss into an optical cavity of a laser to interrupt the steady state continuous wave operation of the laser.

An alternative and innovative approach to synthesizing a power versus time profile of FIG. 5 is to capitalise on the transient behaviour of this type of laser to deliberately trigger a series of high frequency small pulses, each of peak power well above the steady state continuous wave output of the laser, but well below the normal level of Q-switched pulses. Such a transient response should be able to be triggered when operating in steady state cw mode by introducing optical loss into the optical resonator for a fraction of a microsecond, long enough to extinguish the lasing action and the corresponding stimulated emission, therefore reducing the photon flux to approximately zero. In this scenario, N should remain approximately equal to Nph, but gradually increase to above this since the generation of excited electrons now exceeds their recombination. This allows energy to be stored in the laser rod, with the amount determined by the duration of application of loss to the optical cavity. If the loss is almost immediately removed, stimulated emission would be allowed to reinitiate, but at a much lower level than steady state due to the much lower photon flux that is way below the steady state value. This therefore should allow the gain to remain below unity for a period during which N therefore would continue to increase to a level well above $N_{ph}$ as shown in FIG. 9. The increasing N and photon flux should eventually lead to the gain exceeding unity, triggering the generation of a small pulse from the laser output. Such a pulse will lead to N falling to well below $N_{ph}$, but to a value still well above that existing after normal high energy Q-switched pulses. In this case, the gain falls naturally to below unity without the need for the introduction of loss into the optical cavity and so the photon flux does not fall to such a low value. This process then repeats itself except that the next pulse should be a little smaller as shown in FIG. 9 because it will be triggered more quickly due to the photon flux not needing to build from almost zero. Following several more of these cycles, with each subsequent pulse being a little smaller as shown, the laser output relaxes back to a steady state output.

Importantly for the laser doping process, the frequency of these small pulses during the transient period of its underdamped response is sufficiently high that the silicon absorbing the energy does not have a chance to appreciably change temperature between the small pulses due to the silicon's limited thermal conductivity. The silicon therefore effectively filters the waveform of FIG. 9 similarly to in Approach 3. What is therefore important is the average energy delivered to the silicon during the transient period, following which the laser can be made to operate on continuous wave for at least as long as is necessary for the silicon to be molten to facilitate adequate dopant mixing. Provided loss can be introduced into the optical cavity when required and for the desired duration, then this in combination with setting the laser power at the level necessary for the steady state cw operation to maintain the molten silicon at approximately constant temperature, this approach can in theory also be used to control all the important aspects of the Power versus Time profile of FIG. 5 for the laser doping process. This includes the duration of the overall pulse (for the purpose of maintaining the silicon in its molten state for the required period), controlling the amount of energy in the initial high energy transient part of the pulse (that melts the silicon through control of the duration for which the loss is introduced into the optical cavity) and the power level during the steady state cw period of the pulse (that maintains the silicon at constant temperature while the dopants adequately mix). No known existing lasers however have this capability or make it possible for the user to gain this capability. New circuitry for controlling the Q-switch has had to be developed for introducing the loss into the optical cavity to allow this flexibility and control by the user.

Another approach is to use the 532 nm wavelength laser on continuous wave mode to avoid the thermal cycling that exacerbates the defect generation, but simultaneously move the laser beam during the heating/melting process so as to control the amount of energy being delivered to the silicon being doped in a particular location and therefore the temperature it reaches. For example, a particular location being laser doped can be heated somewhat without direct exposure to the laser beam by delivering the laser energy to a nearby location and using the thermal resistance of the silicon and the distance away from the location, to control how much energy is delivered to the location being doped. For example, if it was possible to instantly move the laser beam from one location to another location, the power delivered to a particular location being laser doped could be made to take the form of FIG. 5 whereby period $t_1$ represents the initial direct application of the continuous wave (cw) laser to the location being laser doped, following which it is relocated to a nearby location for time $t_2$ where the thermal resistance of the silicon reduces the energy delivered to the location being laser doped as shown in FIG. 5, following which the laser beam is removed well away so that the energy delivered to the location being laser doped is reduced to a negligible value. Although in theory this is feasible, in practice lasers cannot operate quite like that, firstly because they cannot instantly change location and secondly, because the laser beam, even when focused has a finite diameter, usually greater than 10 microns which makes it impossible to precisely deliver power of the form of FIG. 5 to all parts of the silicon directly exposed to the silicon beam during $t_1$.

Figure 10:
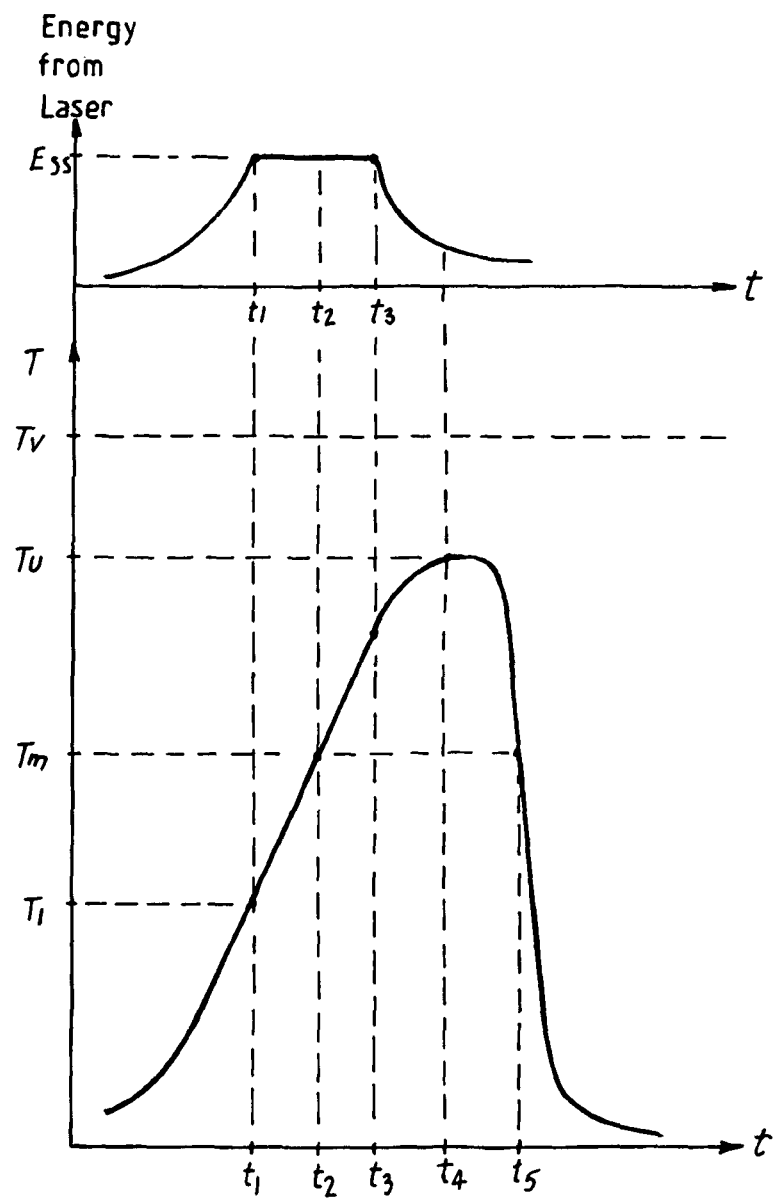
FIG. 10 graphically illustrates one example of how laser output power for a continuous wave laser may be varied in conjunction with scanning speed and beam diameter to achieve a desirable and incident power profile at a point over which the laser is scanned.

However, by appropriately controlling the steady state power of the cw laser $E_{ss}$ and then scanning the laser beam at the right speed towards the location to be laser doped and then away again from the location at the right speed, the energy delivered to this particular location can take the form as shown in the top graph of FIG. 10. As shown in the bottom graph of FIG. 10, this can facilitate the melting of the silicon in this location while also facilitating keeping it molten for at least 2 microseconds to enable adequate dopant mixing while simultaneously avoiding ablation of the silicon and repeated thermal cycling. If however the scan speed for the laser is too high, then the silicon may not even reach the melting temperature at the location being laser doped or alternatively, the silicon may melt but not remain molten long enough for the dopants to adequately mix. At the other extreme, if the laser scan speed is too low for the given laser power $E_{ss}$, then too much energy will be delivered to the molten silicon and it will exceed temperature $T_v$ at which the silicon and dopants will be ablated.

Similarly there exists only a certain range of acceptable power levels for $E_{ss}$ from the laser for which the laser doping process will be adequately performed. $E_{ss}$ values too low will either fail to melt the silicon or else necessitate such slow scanning speeds for the laser to achieve melting that the process is not viable. At the other extreme, $E_{ss}$ values too high will necessitate such high laser scanning speeds to avoid ablation of the silicon that the energy delivered to the location will fall to too low a value too quickly to keep the silicon molten for the required 2 microseconds or longer.

For example, using a 13 Watt 532 nm cw laser with a scan speed for the continuous wave laser of 3 m/sec and a beam diameter of 12 microns, each point will be directly illuminated by the laser for 4 microseconds. When the laser power is well matched to the scan speed as shown in FIG. 10, the silicon will need to be illuminated by the laser for almost half the total direct illumination time to reach the silicon melting point of about 1400 degrees C. at time $t_2$. For this example, this will mean that the laser beam will have illuminated the given point for almost 2 microseconds before the silicon at that point melts. By the time the direct illumination ceases (in this case after a further 2 microseconds at time $t_3$) the molten silicon will have been molten for at least 2 microseconds while being heated to almost 2,000 degrees C., still well below the ablation temperature for silicon. For the next 1-2 microseconds, the laser beam, although moving further away from the given point, still delivers sufficient heat to the given point to allow its temperature to continue to increase following which it cools quite rapidly, reaching the freezing temperature of 1400 degrees C. for the silicon at time $t_4$. Overall it is therefore possible with this approach to avoid ablation of the silicon, avoid thermal cycling of Q-switched operation, still keep the silicon molten for at least 2 microseconds, while still using high laser scanning speeds suitable for high throughput commercial production. Using the same $E_{ss}$ value from the 13 Watt laser, scan speeds as low as 2 m/s can be used before ablation of the silicon commences while scan speeds as high as 5 m/s can be used while still keeping the silicon molten for at least 2 microseconds.

Unfortunately laser power levels below about 12 Watt cease to be able to melt the silicon without unacceptably low scan speeds. Increasing the power level though to 14 Watts allows a scan speed as high as 10 m/s to be used. In this case, in FIG. 10, the time period from $t_1$ to $t_2$ is about 1 microsecond followed by a little over 1 microsecond of further direct illumination of the laser until $t_3$. The silicon temperature peaks at time $t_4$ following which freezing at $t_5$ occurs at about 2 microseconds after $t_2$ when the silicon melted. Consequently the conditions are satisfied for adequate laser doping of the silicon. At this power level, the slowest scan speed acceptable is 3-4 m/s, below which silicon ablation commences.

Figure 11:
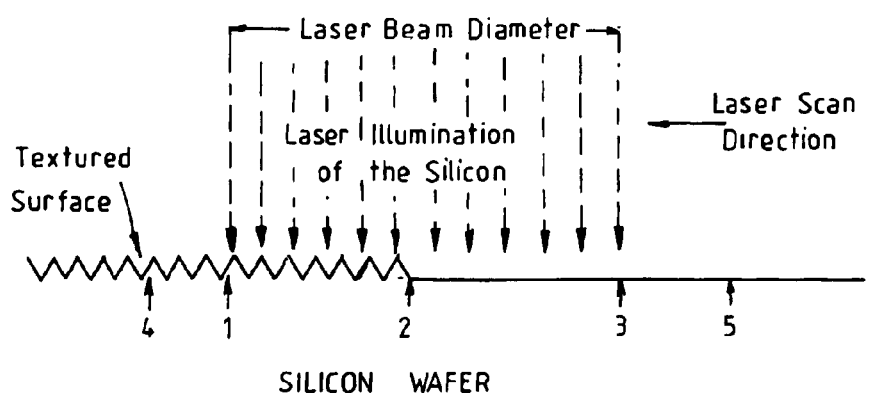
FIG. 11 schematically illustrates the effect on a silicon surface under a scanned laser beam using a proposed laser control method.

One method for adjusting the laser scan speed to be appropriate for a given laser power $E_{ss}$ (or visa versa) is to ensure the laser melts the silicon when the laser beam has passed approximately halfway over the point being laser doped. This is equivalent to saying that in FIG. 10, for a constant laser scanning speed, the time interval between $t_1$ and $t_2$ is approximately the same as the time interval from $t_2$ to $t_3$. FIG. 11 shows a schematic representing this where the unmelted silicon illuminated by the laser beam for less than the time interval $(t_2-t_1)$ still has surface pyramids while the part of the surface illuminated by the direct laser beam for longer than $(t_2-t_1)$ has already melted, therefore destroying the pyramids and providing a much flatter and more reflective surface. In FIG. 11, point 4 has not yet been illuminated by the beam while point 3 has just finished being illuminated and point 5 has already been passed by the beam and cooled. For a constant scan speed laser, best results are achieved when the ratio between the distance between point 1 and 2 to the distance between the points 2 and 3 is within the range 1:3 to 3:1. For practical laser speeds with ratios below 1:3, the silicon near point 3 has been exposed to the laser beam for too long while in the molten state so that ablation of the silicon commences. At the other extreme, for ratios above 3:1, the resolidified and cooled silicon at point 5 runs the risk of having not been molten for more than 1 microsecond to facilitate adequate mixing of the dopants. This provides a relatively simple mechanism to check whether the laser scan speed is properly matched to the laser power since the reflection from the surface illuminated by the beam can be measured to indicate what percentage of the illuminated area is still covered by pyramids and therefore not yet melted which in turn indicates whether the ratio is within the correct range. If the ratio is too small, the surface reflection will be too high due to more than 75% of the area being illuminated by the beam being quite flat and therefore reflective, while too high a ratio will mean that more than 75% of the area being illuminated by the beam will be still covered by pyramids making the surface far less reflective. Various techniques can be used to measure the surface reflection of the illuminated area for these purposes. For example it is common to use reflected light from the illuminated area for the purposes of viewing the area being processed by the laser. Measuring the intensity of this reflected light such as with a photo-detector or solar cell will give the required information. This information can be fed back to the laser controller to allow it to automatically adjust either the scan speed or the laser power to ensure the ratio always remains within the correct or desired range.

Referring back to FIG. 10, several conditions for good laser doping can be identified, for which appropriate values of $E_{ss}$ and scan speed need to be chosen (in conjunction with each other) to satisfy. Firstly, the maximum temperature reached by the silicon $T_u$ must be greater than the melting temperature for the silicon $T_m$ and lower than the vaporisation temperature $T_v$. Secondly, the time period $t_5-t_2$ for which the silicon is molten, must exceed 1 microsecond and preferably exceeds 2 microseconds. Thirdly, the scan speed for the laser when achieving the results of FIG. 10 needs to be at least 1 m/s for practical purposes relating to device throughput. Fourthly, scan speeds in excess of 20 m/s are unsuitable due to failure to keep the silicon molten for long enough. Fifthly, 532 nm wavelength cw lasers below 10 watts provide Ess values too low to allow the silicon to be melted while simultaneously achieving adequate scan speeds to be practical. Sixthly, 532 nm wavelength cw lasers operated at power levels above 20 Watts provide Ess values that are too high, therefore necessitating scan speeds for the laser that are too fast to allow the molten silicon to remain molten for more than 1 microsecond as required.

For the above 5 approaches, line lasers can in general be used instead of lasers that illuminate a single point. For a line laser where an entire line rather than a small circle of typically 15 microns diameter is simultaneously illuminated, all the same principles of these approaches apply but whereby no Q-switched pulses are generated during the time period where the laser is being moved from the location of one line being laser doped to the location of the next line to be laser doped. For a continuous wave laser however, the scan speed for shifting the laser beam from the location of one line to that of the next has to be fast enough so that the silicon being illuminated in between does not have time to reach melting point. In this case the scan speed is variable whereby the scan speed is reduced approaching the location of a given line for laser doping and then speeds up when departing that location to move to where the next line is to be located. In this way, varying the scan speed still allows the Energy from the laser to take the form given in FIG. 10 whereby the scan speed is slow between time $t_1$ and $t_3$.

Liquid Jet and Gaseous Solutions.

In some embodiments the laser may be enveloped in a liquid jet such that the substrate surrounding the point of laser heating is kept cool, and the liquid can be used to deliver reagents to the point of processing under the laser.

FIG. 12 schematically illustrates the arrangement of a laser and liquid jet when used to process a substrate provided with a dielectric surface layer. In this case the surface layer need not provide a dopant source. As illustrated, a laser 60 emitting a laser beam 61 is projected through a covered window 62 in a nozzle unit 63. A liquid jet 64 is generated by the nozzle unit into which the laser beam 61 is coupled such that it may be guided by total internal reflection towards the target. A supply of liquid to the nozzle unit 63 is provided through ports 65 and is expelled through a nozzle orifice 66 which projects the liquid towards the target. The window 62 is oriented to receive a vertical laser beam 61 which is directed axially into the liquid jet 64. The laser beam 61 is focussed by appropriate lenses 67 before entry through the window 62. Liquid is delivered to the nozzle unit 63 with a pressure of between 20 to 500 bar via the liquid supply port 65. The liquid may be supplied from a reservoir 72 or other suitable source and pumped under pressure to the nozzle unit 63 by supply pump 73. The liquid may also be heated by heater 74 so that the temperature of the liquid jet may be controlled. The generated liquid jet 64 may have a diameter in the range of approximately 20 to 100 μm.

The liquid jet 66 and laser beam 61 are shown directed to a target which is a 250 μm silicon substrate 68 with a 30-80 nm thick silicon nitride layer surface layer 69. The liquid jet 64 and laser beam 61 are guided over regions of the surface layer as with conventional laser doping methods. By adding phosphoric acid to the liquid jet a strong corrosive action will take place on the silicon nitride layer and the underlying silicon where the surface becomes heated by the laser beam 61 leaving the surface layer 69 very cleanly and precise ablated, whereas the substrate 68 is left substantially intact elsewhere. Additives are added to the liquid jet 64 from one or more supply tanks 75 and injected by respective pumps 76 into the portal 77 of the nozzle unit 63. However n-type doping of a surface region 71 of the silicon can also be performed simultaneously with the nitride removal by virtue of the phosphoric acid used for cleaning, or by the inclusion of additional dopant additives such as POCl3, PCl3, PCl5, or a mixture of these. P-type doping could also be achieved in a similar operation by selecting the appropriate dopants (e.g. Boron).

The liquid jet 66 and laser beam 61 may also be used with dopant sources included within a surface dielectric layer 17, sources applied as a coating on top of or below the dielectric layer (also potentially the antireflection coating 16), or the dopant atoms may be present in the silicon in an unactivated state whereby they are absorbed into the silicon structure (or activated) by the melting and refreezing process as described above with reference to other laser systems.

Figure 13:
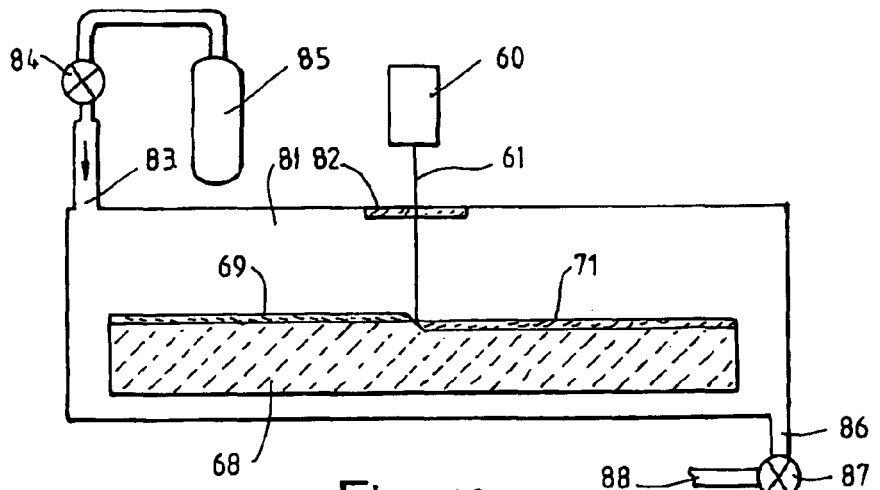
FIG. 13 schematically illustrates a laser operated to heat a target in a gaseous environment to process a surface of a target.

Laser operations may also be performed in a gaseous environment to achieve the doped surface region 71 without providing dopant in the liquid jet. Referring to FIG. 13, in this case the laser 60 emits laser beam 61 which is directed through a window 82 in a chamber 81 containing the target substrate 68. A dopant source in gaseous form is supplied from a pressurised storage cylinder 85 via control valve 84 and port 83, into the chamber 81. Gas is expelled from the chamber via exhaust port 86 and exhaust vale 87 to a disposal passage 88. The laser is scanned over the surface of the substrate 68 as before, melting the antireflection coating 69 and a portion of the underlying surface whereby the gaseous dopant is absorbed into the molten silicon surface material to form the doped surface layer 71.

While the use of a gaseous environment is described above in conjunction with the use of a laser beam projected within a liquid jet the gaseous environment may equally be employed with any of the other laser arrangements described above that are not associated with a liquid jet. Liquid dopant sources may also be employed with any of the laser arrangements described, other than as a liquid jet through which the laser beam is projected. The liquid source may be pooled or flowed over the surface which is being doped or may be applied as a jet directed at the point of laser heating.

Preferred Anti-Reflection Coatings

Embodiments of a multiple layer ARC are described below that can be deposited in a single process (using a single piece of equipment) to achieve thermal expansion mismatch correction for a high efficiency commercial solar cell.

The approach adopted is to use a triple layer ARC that can be deposited in a single in-line PECVD, E-beam or sputtering deposition process. The first very thin layer could be silicon nitride and need only be thick enough to provide surface passivation and the hydrogen source for subsequent passivation of the silicon, but not too thick so as to stress the silicon surface during thermal cycling. The second layer is expected to be about 100 to 300 angstroms thickness of a material with thermal expansion coefficient less than the semiconductor material being processed to ensure the semiconductor surface is placed under compression rather than tension when at elevated temperatures. This provides relief from the thermal expansion mismatch which would otherwise be created between the ARC and the semiconductor material, and which leads to defect generation at elevated temperatures due to the semiconductor surface being placed under tension by the overlying ARC. Importantly, the thickness of this second layer needs to be thin enough so as to not have significant impact optically. The third and by far the thickest layer is a material such as silicon nitride deposited with the right thickness and refractive index to provide the required antireflection optical properties for the ARC.

By way of example, when the semiconductor material from which a device is fabricated is crystalline silicon, this material is known to easily sustain defects when the surface is under tension, particularly if at elevated temperature. Silicon nitride, deposited by plasma enhanced chemical vapour deposition (PECVD), is known to do a good job passivating the silicon surface, bulk and grain boundaries, primarily due to the high concentration of atomic hydrogen present in the deposited silicon nitride that is able to tie up dangling bonds at the silicon surface, defects or grain boundaries. A thin layer of PECVD silicon nitride in the range of 10-200 angstroms thick is therefore a good choice for the first layer when the semiconductor is crystalline silicon.

A good choice for the second layer in this example would be silicon dioxide or silicon oxynitride since these have a thermal expansion coefficient less than that of silicon and can also be deposited by PECVD by appropriately varying the gases and their flow rates. The thickness of this layer is quite important. If too thick it excessively degrades the optical properties of the overall ARC since its refractive index is not well suited to the requirements of the ARC. If too thin, the layer is unable to compensate for the stress created on the silicon surface by the overlying third layer of the ARC which is significantly thicker. This second layer is at least as thick as the first layer but not as thick as the third layer. With PECVD it is possible to tailor this layer in terms of having a graded composition and refractive index to further aid with the optimisation. The inclusion of some nitrogen allows silicon oxynitrides of virtually any refractive index from below 1.5 to above 2 to be achieved.

A good choice for the third layer is PECVD silicon nitride which can be deposited in the same equipment and process as the first two layers. It has close to an ideal refractive index, while the thickness is chosen in conjunction with the thicknesses of the first two layers to overall give the best anti-reflection properties. Typical thicknesses of the three layers are 100 angstroms for the first layer with refractive index of 2.0, 180 angstroms for the second layer with refractive index of 1.5-1.6, and 400 angstroms for the third layer with refractive index of 2.0. The overall reflection for this multi layer ARC is almost identical to an ideal SLARC with only about a 1% increase in reflection.

Example 1

The application of the multi-layer ARC to multicrystalline silicon wafers has demonstrated efficiencies in the vicinity of 17% using standard commercial grade p-type multicrystalline silicon wafers. An example of a suitable fabrication sequence is as follows:

1. Isotropic texturing 12 of the front (or light receiving) surface of the p-type wafer 11;
2. front surface diffusion of n-type dopant 13;
3. edge junction isolation/psg removal;
4. four layer ARC deposition on the front surface by PECVD;
    a. 100 angstroms of hydrogen rich silicon nitride 14;
    b. 180 angstroms of silicon oxynitride 15 of refractive index 1.5-1.6;
    c. 400 angstroms of silicon nitride 16 of refractive index 2.0-2.1;
    d. Optional additional dopant containing layer 17; (This layer may be used
    if dopants are not already included in the already deposited layers and where an additional separate dopant layer is not to be applied subsequently) with refractive index optically matched to the encapsulant to be used during module formation to alleviate the need to remove the dopant source layer following the laser doping process
5. screen-print rear (non-light receiving) surface with aluminium for rear contact 18;
6. fire rear surface to sinter rear contacts 18 and form back surface field 19 by formation of aluminium/silicon alloy and liquid phase epitaxy;
7. Optional (if step 4d is omitted) application of an n-type dopant source 21 to front surface (liquid phosphorus or in order to alleviate the need to remove the source following the laser doping process another dopant containing source with refractive index optically matched to the encapsulant to be used during module formation)
8. laser doping of silicon in localised regions to form heavily doped (n+) regions 22 for formation of self-aligned front surface metal contacts;
9. Plating a layer of Nickel 23 over the laser doped n+ regions 22 for the front surface contacts;
10. sintering of Nickel 23;
11. Plating of layers of Copper 24 and Tin 25 (or Silver) over the Nickel 23;

The above processing sequence produces the high performance solar cell structure of FIG. 1 with a selective emitter that provides heavy doping of the silicon directly beneath the metal contacts. The four layer ARC (counting the step 4d dopant source) performs well optically, with only about 1% increase in reflection compared to a single layer ARC following encapsulation whereby the single layer comprises silicon nitride with the same refractive index as the third layer and with optimal thickness. In terms of defect generation, during the laser doping, the regions immediately adjacent to the molten regions are heated to almost 1400 degrees Celsius, but encounter minimal defect generation due to the low thermal expansion of the second layer (deposited in step 4b) avoiding significant tension being applied to the silicon surface. The first layer (deposited in step 4a) contains sufficient atomic hydrogen to facilitate surface and grain boundary passivation for the multicrystalline silicon during the deposition process and during the short high temperature treatment during the firing of the aluminium rear contact.

Previously large volume commercial manufacture of multicrystalline silicon solar cells with selective emitters has not been achievable. Even with the benefits of the laser doping techniques for localised doping of the silicon, previous attempts at making high performance selective emitter solar cells have failed for the following reasons:

1. The use of a SLARC has lead to excessive defect generation juxtaposed to the molten regions during the laser doping process due to the high thermal expansion coefficient of the ARC material that places the silicon surface under tension;
2. The use of an SiO2 layer of optimal thickness instead of the silicon nitride layer is able to avoid the defect generation, but has poor optical properties due to its low refractive index leading to unacceptably high levels of surface reflection;
3. A thin thermally grown SiO2 layer of typically 180 angstroms thickness prior to silicon nitride deposition has been able to overcome the problems associated with the thermal expansion mismatch between the silicon and the silicon nitride, but has introduced three other problems. Firstly, it involves an additional process that cannot be done in the PECVD system since such thermally grown oxides need temperatures in excess of 900 degrees. Secondly, the requirement for such high temperatures during the SiO2 growth often damages the multicrystalline silicon wafer. Thirdly, the SiO2 layer acts as a barrier to the atomic hydrogen, preventing it from passing from the silicon nitride layer into the silicon where it is required for passivation of the grain boundaries.

An approach that still incorporates the traditional SLARC technique involves modifying step 4 of the sequence in the above example as follows to apply an expansion mismatch correction material layer after a conventional SLARC:

4'. four layer ARC deposition on the front surface by PECVD;
 a. 100 angstroms of hydrogen rich silicon nitride (optional);
 b. 600 angstroms of silicon nitride having a refractive index of 2.0-2.1;
 c. 1,000 angstroms of silicon dioxide or silicon oxynitride having a refractive index of 1.5-1.6. Optionally this layer may include dopant for the laser doping step (step 8). The refractive index may be optically matched to the encapsulant to be used during module formation to alleviate the need to remove the dopant source layer following the laser doping process, or optionally the layer may be removed after completion of thermal processing. Note also that 4a. and 4b. above can potentially be combined in this embodiment to be a single layer of silicon nitride of thickness about 700 angstroms.

A variation of the present multi-layer ARC that facilitates zero thickness for the first (ie passivation) layer can be used if certain conditions are met that alleviate the need for such high quality surface passivation. These include:
 a) firstly, devices that are only required to achieve relatively low voltages below 650 mV that therefore do not require the same quality of surface passivation;
 b) secondly, devices that have a diffused surface that reduces the need for such a low surface recombination velocity to achieve a given open circuit voltage for the device;
 c) thirdly, devices with a shallow junction of less than 1 micron depth so that the poorer surface recombination velocity compared to when the first layer in step 4a is used does not have severe consequences for the collection probabilities for charge carriers generated from short wavelengths of light in the vicinity of 300-500 nm; and
 d) fourthly, where atomic hydrogen is incorporated into the layer deposited in step 4b and the layer is made thin enough so as not to act as too severe a barrier to the passage of atomic hydrogen into the silicon to passivate the grain boundaries or alternatively, a silicon nitride layer is deposited onto the rear surface of the wafer to provide the hydrogen source for the grain boundary passivation.

Another example of the potential use of a multi-layer ARC is in regard to single crystalline silicon material where there is no necessity for grain boundary passivation. In this case the first layer deposited in step 4a can be significantly thinner since significantly less atomic hydrogen is required. By having this layer thinner, it is also acceptable to have its refractive index well above that of silicon nitride by making the layer silicon rich without fear of excessive absorption of the short wavelengths of light. The higher refractive index layer provides superior surface passivation with lower interface defect densities which is important in high voltage devices which are feasible with the higher quality single crystal silicon wafers. In this implementation of the multi-layer ARC, the second and third layers still perform the functions described in the example above and can have deposition parameters as previously indicated.

In another example of the use of the multi-layer ARC, if thermal diffusions are used instead of laser doping to produce the heavily doped regions beneath the metal contacts, the ARC can be used as a diffusion mask. In this case, the third layer for the ARC needs to be significantly thicker since the dopants also diffuse into the silicon nitride layer as well as the exposed silicon unless the dopants are selectively deposited in localised regions such as by inkjet printing of the dopants. In either case, the low thermal expansion coefficient of the second layer is again required to prevent the silicon surface from being placed under tension during the thermal diffusion process.

It will be appreciated by persons skilled in the art that numerous variations and/or modifications may be made to the invention as shown in the specific embodiments without departing from the scope of the invention as broadly described. The present embodiments are, therefore, to be considered in all respects as illustrative and not restrictive.

The invention claimed is:

1. A method of forming a doped surface region of a semiconductor material at a surface of a semiconductor solar cell device during its manufacture,
 the semiconductor material comprising silicon,
 a dielectric material surface layer extending over the surface region of the semiconductor material and the doping being performed in one or more localised regions of the semiconductor material, the method comprising:
 locally heating a surface of the semiconductor material in an area to be doped to locally melt the semiconductor material to form a molten semiconductor material,
 the melting being performed in the presence of a dopant source whereby dopant from the dopant source is absorbed into the molten semiconductor material, and
 wherein the heating is performed in a controlled manner such that a region of the surface of the semiconductor material in the area to be doped is maintained in a molten state without refreezing for a period of time greater than one microsecond.

2. The method of claim 1 wherein the dielectric material surface layer is provided to perform one or more of the functions of a surface passivation coating, an antireflection coating, or a plating mask.

3. The method of claim 1 wherein the area to be doped is progressively doped by sequentially locally heating regions within the area to be doped.

4. The method of claim 3 wherein a heating source is continuously scanned over the surface of the semiconductor material such that the region being heated is continuously moving over the surface, creating a moving melting edge and a molten tail extending from a region of refrozen doped material.

5. The method of claim 3 wherein a heating source is continuously scanned over the surface of the semiconductor material, such that a currently heated region overlaps previously heated regions whereby heating one region contributes heat to an adjacent previously heated region, and to which the source is no longer applied, to reduce a rate of cooling of the previously heated region.

6. The method of claim 5 wherein the heating source has a constant output.

7. The method of claim 3 wherein the heating is applied to discrete regions such that a newly heated region will melt and will also contribute heat to an adjacent previously heated region, and to which the source is no longer applied, to reduce a rate of cooling of the previously heated region.

8. The method of claim 7 wherein, a region is subjected to refreezing and remelting to achieve required level of doping and the remelting occurs no more than 3 times.

9. The method of claim 8 wherein remelting occurs no more than once.

10. The method of claim 1 wherein the intensity of heating is varied over time between a higher level used to initially melt a region and a lower level used to maintain the molten state.

11. The method of claim 10 wherein the level of heating is decreased after melting a region until and whereby the region being heated overlaps an already molten region by less than a predetermined percentage.

12. The method as claimed in claim 1 wherein
heating is achieved by scanning one or more a laser beams over the surface of the semiconductor material such that a local region of irradiance by laser beam creates a melted region; and
scanning the laser over the surface progressively melts a continuous line of surface material and a continuous wave (cw) laser is used to heat the surface of the semiconductor material.

13. The method as claimed in claim 1 wherein
heating is achieved by scanning one or more laser beams over the surface of the semiconductor material such that a local region of irradiance by the one or more laser beams creates a melted region; and
scanning the one or more laser beams over the surface of the semiconductor material to progressively melt adjacent such regions to form contiguous group of overlapping such regions.

14. The method as claimed in claim 13 wherein the one or more laser beams comprise
a laser beam of a single Q-switched laser which is operated in a pulsed operation in which the laser beam of the single Q-switched laser comprises
multiple beam pulses each shorter than a maximum beam pulse duration of the Q-switched laser
with the beam pulses irradiating overlapping regions of the surface of the semiconductor material in such a manner so as to simulate the effects of a cw laser
whereby areas of the surface of the semiconductor material irradiated by adjacent beam pulses are sufficiently close to each other spatially to ensure a majority of silicon melted by the irradiation of adjacent beam pulses remains molten between the adjacent beam pulses, as the laser beam of the single Q-switched laser is scanned over the surface of the semiconductor material.

15. The method of claim 14 wherein a repetition period of the beam pulses of the Q-switched laser is less than 0.02 microseconds.

16. The method of claim 15 wherein the repetition period of the beam pulses of the Q-switched laser is constant to simulate an output of a constant irradiance cw laser.

17. The method of claim 16 wherein the scanned beam of the Q-switched laser is operated at a substantially constant average level of irradiance on the surface being heated; and
a scanning speed is chosen to melt the surface of the semiconductor material and to maintain a given point on the surface of the semiconductor material in a molten state for a period of at least 1 microsecond but no more than 10 microseconds.

18. The method as claimed in claim 13 wherein
an average irradiance level of the one or more laser beams impinging on the surface of the semiconductor material to locally heat the surface of the semiconductor material varies with time between:
at least a high average irradiance level periodically applied for a predetermined time period $t1$ to cause melting of unmelted semiconductor material on the surface of the semiconductor solar cell device within the time period $t1$; and
a lower average irradiance level applied for a further time period $t2$ after the time period $t1$ and the lower average irradiance level which maintains melted semiconductor material to remain in a molten state for the time period $t2$.

19. The method of claim 18 wherein
the one or more laser beams comprise a continuous or pseudo continuous wave laser beam produced by a cw laser, or a pseudo cw laser,
the continuous or pseudo continuous wave laser beam having an irradiance level which is varied cyclically in synchronisation with a scanning speed of the continuous or pseudo continuous wave laser beam
such that the average irradiance level of the continuous or pseudo continuous wave laser beam increases during a melting period and then decreases until the continuous or pseudo continuous wave laser beam has moved sufficiently over the surface of the semiconductor material for less than a predetermined percentage of the beam to be still exposing molten semiconductor material.

20. The method of claim 19 wherein a period of a cyclic power variation corresponds to a beam width divided by the scanning speed and the period $t1$ is 50% of the cyclic power variation or less.

21. The method of claim 19 wherein the irradiance level of the continuous or pseudo continuous wave laser beam is varied by varying a focus of the continuous or pseudo continuous wave laser beam to spread the continuous or pseudo continuous wave laser beam during the period $t2$.

22. The method of claim 19 wherein the irradiance level of the continuous or pseudo continuous wave laser beam is varied by varying an output energy for a given output period of the continuous or pseudo continuous wave laser beam.

23. The method of claim 22 wherein the one or more laser beams comprise a laser beam of a cw laser and a variable irradiance is provided by operating the cw laser to produce a cyclic variable output having a power level during a first period $t1$ of each cycle which melts irradiated semiconductor material and a power level during a second period $t2$ of each cycle that maintains irradiated melted semiconductor material in the molten state.

24. The method as claimed in claim 22 wherein the continuous or pseudo continuous wave laser beam is a pseudo continuous laser beam and a Q-switched laser is used as the pseudo cw laser to produce the pseudo continuous wave laser beam pulses which vary with time such that each pseudo continuous wave laser beam pulse has a high irradiance period $t1$ and a lower irradiance period $t2$.

25. The method of claim 24 wherein, during the lower irradiance period $t2$ of each cycle, the laser beam of the cw laser has an average power that does not ablate molten semiconductor material.

26. The method of claim 24 wherein the Q-switched laser produces laser beam pulses in which a first period $t1$ of each laser beam pulse has a power level which melts irradiated semiconductor material and a second period $t2$ of each laser pulse has a power level that maintains irradiated melted semiconductor material in the molten state.

27. The method of claim 26 wherein the second period $t2$ has a power level that does not ablate molten semiconductor material.

28. The method of claim 18 wherein during the period $t2$ the molten semiconductor material is kept at a temperature of between 1414° C. and 3265° C. for at least one microsecond.

29. The method of claim 28 wherein during the period $t2$ the molten semiconductor material is kept at the temperature of between 1414° C. and 3265° C. for 2-10 microseconds.

30. The method of claim 18 wherein the one or more laser beams comprise
a laser beam of a single Q-switched laser which is operated in a pulsed operation in which the laser beam of the single Q-switched laser comprises multiple beam pulses each shorter than a maximum beam pulse duration of the Q-switched laser with the beam pulses irradiating overlapping regions of the surface of the semiconductor material in such a manner so as to simulate the effects of a cw laser, a repetition period of the beam pulses being less than 0.02 microseconds and a variable average irradiance is provided by varying the repetition period to produce a cyclic variable laser output, a higher average irradiance level being produced by providing a shorter repetition period of the beam pulses and the cyclic output having an average irradiance level during a first period t1 of each cycle which melts irradiated semiconductor material and an average irradiance level during a second period t2 of each cycle that maintains irradiated melted semiconductor material in the molten state.

31. The method of claim 30 wherein, during the second period t2 of each cycle, the laser beam pulses of the Q-switched laser have an average output irradiance level that does not ablate molten semiconductor material regardless of the period of exposure.

32. The method as claimed in claim 18 wherein laser beams from more than one laser are used to heat the surface of the semiconductor surface such that a laser beam of one laser is used to melt the surface of the semiconductor material and a laser beam of a second laser is used to maintain the surface region of the semiconductor material at a temperature to remain molten for a period greater than 1 microsecond to allow the dopant to be absorbed and distributed throughout the molten region.

33. The method of claim 32 wherein Q-switched lasers are used to heat the surface of the semiconductor material.

34. The method of claim 32 wherein a first, Q-switched, laser is used to melt the semiconductor material with a beam pulse rate and beam scanning speed selected to allow overlapping exposed areas for consecutive beam pulses.

35. The method of claim 34 wherein the beam pulses of the Q-switched laser are of an intensity whereby the semiconductor material is melted with a single laser beam pulse and the beam pulses have a duration of less than 10% of the beam pulse repetition period.

36. The method of claim 35 wherein an area of irradiation of each beam pulse is overlapped with an area of irradiation of the previous beam pulse on the surface of the semiconductor material by 10-50% of an exposure area of the beam pulses.

37. The method of claim 34 wherein a laser beam of a second laser is used to ensure that the semiconductor material remains molten between the beam pulses of the first laser.

38. The method of claim 37 wherein the second laser is a cw laser operated with a constant output beam intensity.

39. The method of claim 37 wherein the second laser is a Q-switched laser which is operated to produce output beam pulses in periods between the beam pulses of the first laser and the second laser is operated at a lower beam pulse irradiance than the first, Q-switched, laser to extend a time during which semiconductor material melted by the first laser remains molten.

40. The method of claim 39 wherein the second laser is operated in a beam pulsed operation in which it emits multiple beam pulses each shorter than a maximum beam pulse duration of the Q-switched laser, and the second laser is scanned at a rate such that successive beam pulses of the second laser irradiate overlapping regions of the semiconductor material, the repetition period of the beam pulses of the second laser being less than 0.02 microseconds, and the repetition period of the beam pulses of the second laser being constant, to simulate a constant output cw laser at least during the period between the beam pulses of the first laser.

41. The method as claimed in claim 1 wherein an area to be doped comprises an entire surface of the semiconductor material to create a surface emitter layer.

42. The method as claimed in claim 1 wherein an area to be doped comprises a part of an entire surface of the semiconductor material where contacts are to be formed on a light receiving surface of a solar cell.

43. The method as claimed in claim 1 wherein the dielectric layer carries dopant atoms to perform as the dopant source.

44. The method as claimed in claim 1 wherein the dopant source is a coating which carries dopant atoms located on top of or below the dielectric layer.

45. The method as claimed in claim 1 wherein dopant atoms are present in the silicon in an unactivated state to perform as the dopant source whereby the dopant atoms are absorbed into the silicon structure when the molten silicon crystallizes.

46. The method as claimed in claim 1 wherein the dopant source is in a gaseous state and the heating is performed in an environment containing the gaseous dopant source.

47. The method as claimed in claim 1 wherein the dopant source is in a liquid state and the heating is performed while the liquid dopant source is applied to the heated surface.

48. The method as claimed in claim 1 wherein the surface of the semiconductor material is maintained in a molten state for a period which permits substantially uniform distribution of the dopant throughout the molten semiconductor material.

49. The method as claimed in claim 1 wherein the surface of the silicon material is maintained in a molten state for a period which permits all of the molten region to achieve the same overall dopant polarity.

* * * * *

UNITED STATES PATENT AND TRADEMARK OFFICE
CERTIFICATE OF CORRECTION

PATENT NO.         : 9,136,126 B2                                    Page 1 of 1
APPLICATION NO.    : 13/148797
DATED              : September 15, 2015
INVENTOR(S)        : Wenham et al.

It is certified that error appears in the above-identified patent and that said Letters Patent is hereby corrected as shown below:

On the title page item (73), change "NewSouth Innovations Pty Limited, Sydney (AU)" to --"NewSouth Innovations Pty Limited, Sydney (AU) and Suntech Power International Ltd. Switzerland (CH)"--

Signed and Sealed this
Sixteenth Day of February, 2016

Michelle K. Lee
*Director of the United States Patent and Trademark Office*